United States Patent
Cavalloni et al.

(10) Patent No.: US 11,209,325 B2
(45) Date of Patent: Dec. 28, 2021

(54) MEASUREMENT TRANSDUCER FOR SIMULTANEOUSLY MEASURING A FORCE THAT CAN BE BOTH DYNAMIC AND STATIC

(71) Applicant: Kistler Holding AG, Winterthur (CH)

(72) Inventors: Claudio Cavalloni, Regensdorf (CH); Kim Pfluger, Winterthur (CH)

(73) Assignee: Kistler Holding AG, Winterthur (CH)

( * ) Notice: Subject to any disclaimer, the term of this patent is extended or adjusted under 35 U.S.C. 154(b) by 270 days.

(21) Appl. No.: 16/462,097

(22) PCT Filed: Oct. 5, 2017

(86) PCT No.: PCT/EP2017/075308
§ 371 (c)(1),
(2) Date: May 17, 2019

(87) PCT Pub. No.: WO2018/099633
PCT Pub. Date: Jun. 7, 2018

(65) Prior Publication Data
US 2020/0271531 A1    Aug. 27, 2020

(30) Foreign Application Priority Data

Nov. 30, 2016    (EP) ..................... 16201405

(51) Int. Cl.
*G01L 1/16*    (2006.01)
*G01L 5/167*    (2020.01)

(52) U.S. Cl.
CPC ................... *G01L 1/165* (2013.01)

(58) Field of Classification Search
CPC . G01L 9/08; G01L 15/00; G01L 19/00; G01L 23/10; G01L 1/00; G01L 1/10;
(Continued)

(56) References Cited

U.S. PATENT DOCUMENTS

| 4,441,044 A | 4/1984 | Ruckenbauer et al. |
| 4,546,658 A | 10/1985 | Rocha et al. |

(Continued)

FOREIGN PATENT DOCUMENTS

| DE | 3705471 | 9/1988 |
| EP | 0065511 | 11/1982 |

(Continued)

OTHER PUBLICATIONS

Japanese Office Action and Translation dated Jun. 17, 2020. 8 pages.
(Continued)

*Primary Examiner* — Brandi N Hopkins
(74) *Attorney, Agent, or Firm* — Dority & Manning, P.A.

(57) ABSTRACT

A measurement transducer for simultaneously measuring a force that can be both dynamic and static includes at least one piezoelectric transducer element having element surfaces on which the force generates electrical polarization charges proportional to a magnitude of the force. The measurement transducer includes a resonator element which can be excited to at least one resonance frequency and undergoes a transverse expansion from the action of the force in a transverse direction to the force. The magnitude of the transverse expansion is proportional to the magnitude of the force and causes in the resonance frequency a change that is a function of the force.

17 Claims, 14 Drawing Sheets

(58) Field of Classification Search
CPC ..... G01L 1/16; G01L 9/00; G01L 5/16; G01P 15/09; G01G 3/13; H01L 41/09; H01L 41/113; H01L 41/083
See application file for complete search history.

(56) References Cited

U.S. PATENT DOCUMENTS

| | | |
|---|---|---|
| 9,291,512 B2 * | 3/2016 | Schricker ................ G01L 15/00 |
| 2014/0216175 A1 | 8/2014 | Schricker et al. |
| 2015/0226618 A1 | 8/2015 | Shih |

FOREIGN PATENT DOCUMENTS

| | | |
|---|---|---|
| JP | A-57-198811 | 12/1982 |
| JP | A-63-142227 | 6/1988 |
| JP | A-2014-519037 | 8/2014 |
| WO | WO 2012164016 | 12/2012 |
| WO | WO 2015139149 | 9/2015 |

OTHER PUBLICATIONS

International Search Report and Written Opinion of the International Searching Authority and English Translation thereof, dated Jan. 3, 2018, 19 pages.

* cited by examiner

MEASUREMENT TRANSDUCER FOR SIMULTANEOUSLY MEASURING A FORCE THAT CAN BE BOTH DYNAMIC AND STATIC

TECHNICAL FIELD

The invention relates to a transducer for simultaneously measuring a force that can be both dynamic and static according to the preamble of the independent claim.

PRIOR ART

Each of EP0065511A1 and U.S. Pat. No. 4,441,044, which is hereby incorporated herein by this reference for all purposes, teaches a measurement transducer for measuring a dynamic force comprising a piezoelectric sensor element. The piezoelectric sensor element comprises a plurality of disc-shaped plates made of piezoelectric material wherein a disc diameter of the plates is substantially larger than a thickness of the plates. The direct piezoelectric effect in the form of the longitudinal effect is used for measuring the force. The spatial orientation of the piezoelectric material with respect to the force is such that the force acts normally on disc surfaces of the plates and generates electrical polarization charges on the disc surfaces. The electrical polarization charges are received by electrodes and transmitted as charge signals to an evaluation unit. The electrical polarization charges are proportional to the force acting on the discs. Since leakage currents practically always exist, the direct piezoelectric effect can only measure a dynamic force with rates of change in the range of several Hz up to several MHz while quasi-static force measurements with a duration of several minutes are possible.

In contrast, a static force shows no change even over long time periods of hours, weeks and years. The measurement transducer according to EP0065511A1 teaches to utilize the inverse piezoelectric effect for measuring a static force. Another piezoelectric sensor element comprises a plurality of disc-shaped plates made of piezoelectric material to which an alternating electrical field is applied as frequency signals via electrodes. The alternating electrical field stimulates the plates by means of the inverse piezoelectric effect to mechanically oscillate. The alternating electrical field is tunable and is generated by the evaluation unit. Resonance will occur when an excitation frequency of the alternating electrical field is equal to a mechanical natural frequency of the plates, the corresponding frequency is called the resonance frequency. The impact of the static force changes the resonance frequency of the plates, which frequency change is detected by an oscillator circuit of the evaluation unit. According to the teaching of EP0065511A1, measurements of the dynamic force and the static force are done simultaneously.

BRIEF OBJECTS AND SUMMARY OF THE INVENTION

It is an object of the present invention to improve the prior art transducer for simultaneously measuring a force that can be both dynamic and static.

This object is achieved by the features described herein.

The invention relates to a measurement transducer for simultaneously measuring a force that can be both dynamic and static comprising at least one piezoelectric transducer element; wherein the force generates electrical polarization charges on element surfaces of the piezoelectric transducer element, an amount of the generated electrical polarization charges being proportional to a magnitude of the force; comprising a resonator element that can be excited to at least one resonance frequency; wherein the force is applied in a direction of force to the piezoelectric transducer element and to the resonator element; wherein said force causes a transverse expansion in the resonator element, said transverse expansion occurring in the resonator element in a transverse direction, which transverse direction forms a angle with the direction of force that is different from zero, a magnitude of the transverse expansion is proportional to the magnitude of the force; and wherein said transverse expansion causes a frequency change of the resonance frequency, which frequency change is a function of the force.

EP0065511A1 teaches to use two piezoelectric sensor elements for simultaneously measuring a dynamic force and a static force. The two piezoelectric sensor elements are arranged in the same spatial orientation with respect to the force to be measured and are affected by the force to be measured in an identical manner. However, the measuring principles are different. The direct piezoelectric effect is used for measuring the dynamic force while a frequency change of a resonance frequency is used for measuring the static force. Mechanical oscillation is excited by using the inverse piezoelectric effect. In this case, for the direct piezoelectric effect to occur a piezoelectric coefficient must be different from zero. Furthermore, for the inverse piezoelectric effect to occur a piezoelectric modulus must be different from zero. Although it is possible to orientate the piezoelectric material of the piezoelectric sensor elements in such spatial orientations that both the direct piezoelectric effect and the inverse piezoelectric effect occur, the piezoelectric effects in this case are weak and the market requirement of high sensitivity for the direct piezoelectric effect is not achieved.

Moreover, the measurement transducer according to EP0065511A1 is mechanically prestressed. Mechanical prestressing prevents the occurrence of electrical contact resistances between the piezoelectric material and the electrodes when measuring the frequency change in resonance frequency. However, mechanical prestressing also dampens the mechanical oscillations. Therefore, the measurement transducer has a high loss factor which does not meet market needs.

In contrast, the measurement transducer according to the invention comprises a piezoelectric transducer element and a resonator element which can be arranged independently of each other in such spatial orientations to each other and to the force to be detected that the disadvantages of EP0065511A1 are overcome. The piezoelectric transducer element measures the force directly in the load path while the resonator element measures a transverse expansion caused by the force in an oscillation area that is outside the load path. Therefore, it is possible to precisely arrange the piezoelectric transducer element with high sensitivity with respect to the direction of force. Nevertheless, it is possible to arrange the resonator element with respect to the direction of transverse expansion so that it has sufficient space to oscillate in an oscillation area providing the measurement transducer with a high quality factor.

BRIEF DESCRIPTION OF THE DRAWINGS

In the following the invention will be explained by way of example with reference to the figures in which.

DESCRIPTION OF EXEMPLARY EMBODIMENTS OF THE PRESENT INVENTION

Figure 1:
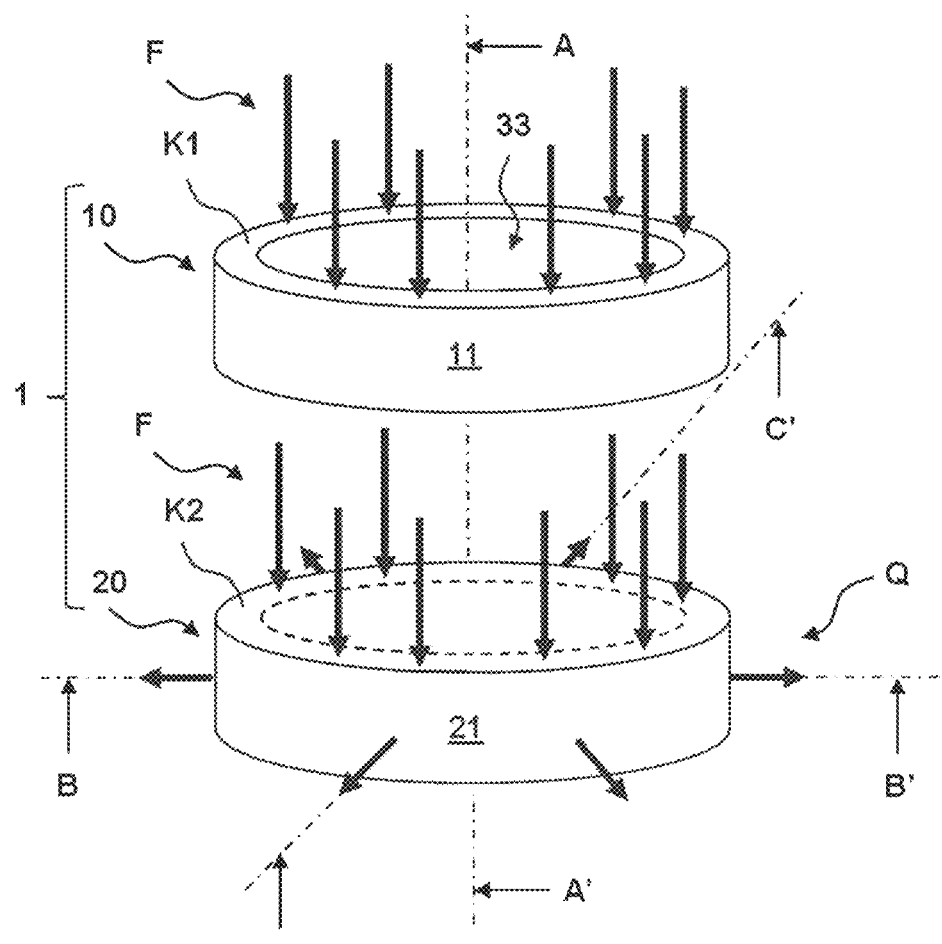
FIG. 1 is a schematic exploded view of a portion of a measurement transducer.

The measurement transducer 1 is configured for simultaneously measuring a force F which may be both dynamic and static. A dynamic force F changes in short periods of time with rates of change in the range of several Hz up to several MHz. A static force F shows no change over long periods of time of hours, weeks and years and has rates of change in the mHz to nHz range. Whether the force F to be detected is dynamic or static solely depends on its rate of change. Those skilled in the art knowing the present invention may also configure the measurement transducer for simultaneous measurement of a dynamic pressure and a static pressure. Furthermore, those skilled in the art may configure the measurement transducer for measuring an acceleration.

Measurement transducer 1 has a longitudinal axis AA', a transverse axis BB' and a diagonal axis CC' as schematically shown in FIGS. 1-9, 12 and 13. The axes extend at an angle to one another, preferably they are perpendicular to one another. For the purposes of the present invention, the term "at an angle" refers any angle that is different from zero at which the axes extend to one another. The longitudinal axis AA' is perpendicular to a transverse plane BC. FIGS. 1 to 9 show several embodiments of a measurement transducer 1 comprising at least one piezoelectric transducer element 10, 10' which measures a force F by means of the direct piezoelectric effect, and comprising a resonator element 20 which measures a transverse expansion Q by means of a frequency change of a resonance frequency. The force F and transverse expansion Q are shown schematically as arrows, which in the case of the force F are pointing parallel to the longitudinal axis AA'. The arrows schematically representing the transverse expansion Q are pointing radially from and perpendicular to the longitudinal axis AA'.

The force F is introduced into the measurement transducer 1 in a direction of force that extends parallel to the longitudinal axis A'. For the purposes of the present invention, this is called the direction of force AA'. The force F acts on the piezoelectric transducer element 10, 10' in at least one transducer contact area K1, K1', the transducer contact area K1, K1' being located in the load path. The force F may act directly or indirectly on the piezoelectric transducer element 10, 10'. The force F acts on the resonator element 20 in at least one resonator contact area K2, K2', said resonator contact area K2, K2' also being located in the load path. The force F may act directly or indirectly on the resonator element 20. In the embodiments as shown in FIGS. 1 to 9, the piezoelectric transducer element 10, 10' is in mechanical contact to the resonator element 20 over the resonator contact area K2, K2'.

The piezoelectric transducer element 10, 10' measures the force F directly in the load path while the resonator element 20 measures the transverse expansion Q caused by the force F in an oscillation region which lies outside the load path. The force F causes an elastic deformation of the resonator element 20. The elastic deformation of the resonator element 20 is a function of the force F and is preferably proportional to the magnitude of the force F. A change in length occurs in the resonator element 20 along the longitudinal axis AA', while the transverse expansion Q occurs in the transverse plane BC. A magnitude of the transverse expansion Q is a function of the force, and it is preferably proportional to the magnitude of the force F. In the embodiments as shown in FIGS. 1 to 5, the force F is a compressive force, while in the embodiments according to FIGS. 6 to 9 the force F is a tensile force. The transverse expansion Q may be isotropic or anisotropic. Especially in the case of piezoelectric material, the transverse expansion Q is anisotropic.

The piezoelectric transducer element 10, 10' is hollow cylindrical in shape (ring, sleeve, etc.). The resonator element 20 is cylindrical in shape (disc, round rod, etc.). The longitudinal axis AA' extends through the centers of the piezoelectric transducer element 10, 10' and the resonator element 20. However, those skilled in the art knowing the present invention may also adopt other known shapes of piezoelectric transducer elements and of resonator elements such as polyhedral, cubic, cuboidal, hollow truncated conical, half-discoidal, quarter-discoidal shapes, etc.

The piezoelectric transducer element 10, 10' is made from piezoelectric material 11, 11'. The piezoelectric material 11, 11' is a crystal material such as quartz ($SiO_2$ single crystal), calcium gallo-germanate ($Ca_3Ga_2Ge_4O_{14}$ or CGG), langasite ($La_3Ga_5SiO_{10}$ or LGS), tourmaline, gallium orthophosphate, and piezoceramics, etc. Preferably, the piezoelectric material 11, 11' consists of crystal material belonging to the m, 32, 3m, $\overline{4}$2m, 2m or 23 symmetry classes. Preferably, quartz is used as the piezoelectric material 11, 11' with the orthogonal axes x, y, z being crystal axes and the z axis being the optical axis. An elasticity coefficient $s_{\lambda\mu}=(\delta S_\lambda/\delta T_\mu)$ of quartz is of the same magnitude for different orientations of the piezoelectric material 11, 11' in a plane xy. $S_\lambda$ refers to a mechanical strain tensor in matrix notation while $T_\mu$ denotes a mechanical stress tensor in matrix notation with the tensor indices $\lambda$, $\mu$=1 to 6. Furthermore, a coefficient of linear thermal expansion $\alpha$ of quartz is also the same for different orientations of the piezoelectric material 11,11' in the plane xy.

The force F acts on the piezoelectric transducer element 10, 10' and generates electrical polarization charges on element surfaces of the piezoelectric transducer element 10, 10'. For achieving the direct piezoelectric effect in the form of the longitudinal effect, the piezoelectric transducer element 10, 10' is oriented in such a way that electrical polarization charges are generated on those end faces on which the force F acts. Thus, the end faces are the element surfaces. The end faces are oriented in the transverse plane BC. For achieving the direct piezoelectric effect, a piezoelectric coefficient $d_{i\mu}=(\delta D_i/\delta T_\mu)$ must be different from zero. Wherein $D_i$ refers to an electrical displacement field and $T_\mu$ denotes a mechanical stress tensor in matrix notation with the Latin indices i=1 to 3 and with the tensor indices $\mu$=1 to 6. A sensitivity indicates how strongly the first piezoelectric material 11, 11' responds to the force F, i.e. how many electrical polarization charges the force F is able to generate. The sensitivity is specified by the piezoelectric coefficient $d_{i\mu}=(\delta D_i/\delta T_\mu)$. The piezoelectric material 11, 11' is oriented with respect to the force F to have high sensitivity, preferably maximum sensitivity for the direct piezoelectric effect. Preferably, quartz is used as the piezoelectric material 11, 11', with the orthogonal axes x, y, z being the crystal axes and the z axis being the optical axis. The piezoelectric coefficient $d_{11}$ exhibits maximum sensitivity for the longitudinal effect when the piezoelectric transducer element 10, 10' is cut as an x-ring having an axis x that is normal to a plane yz. The x axis of the x-ring is parallel to the longitudinal axis AA'. The optical axis z of the x-ring is located in the transverse plane BC. However, those skilled in the art knowing the present invention may also use the transverse effect in which case the piezoelectric transducer element is oriented to generate electrical polarization charges on element surfaces that are perpendicular to those end faces on which the force F acts.

Resonator element 20 may also consist of piezoelectric material 21. Preferably, the piezoelectric transducer element 10, 10' and resonator element 20 are made of the same piezoelectric material 11, 11', 21 so that the production of the measurement transducer 1 will be cost-effective and the piezoelectric transducer element 10, 10' and the resonator element 20 will have substantially similar (in a range of plus or minus 10%) physical properties. However, those skilled in the art knowing the present invention may fabricate the resonator element from a composite of a piezoelectric material and a non-piezoelectric material such as a metal, a non-metal, a semiconductor, an organic material, an inorganic non-metallic material, etc. Preferably, the two materials are bonded to each other by material bonding such as thermocompression bonding, adhesive bonding, etc. Excitation of oscillation of the piezoelectric material results in mechanical oscillation of the composite.

The resonator element 20 can be excited by an excitation frequency of the alternating electrical field to exhibit at least one resonance frequency with a fundamental tone and n overtones. Resonance occurs if the excitation frequency is equal to a mechanical natural frequency of the resonator element 20. To obtain the inverse piezoelectric effect a piezoelectric modulus $e_{i\lambda}=\delta D_i/\delta S_\lambda$ must be different from zero wherein $D_i$ is the electric displacement field, $S_\lambda$ refers to the mechanical strain tensor in matrix notation with the Latin indices i=1 to 3 and with the tensor indices $\lambda$=1 to 6. The resonator element 20 is oriented to oscillate as a thickness oscillator or as a longitudinal mode or expansion oscillator or as a flexural mode oscillator or as a face shear mode oscillator or as a thickness shear mode oscillator. Preferably, the resonator element 20 is operated as a thickness shear mode oscillator. Functioning as a thickness shear mode oscillator, the resonator element 20 is oriented in such a way that two end faces of the cylindrical resonator element 20 are displaced in opposite directions in the transverse plane BC. The end faces are located in the transverse plane BC.

The transverse expansion Q causes a frequency change $\Delta f$ of the resonance frequency f of the resonator element 20. The frequency change $\Delta f$ is a function of the force F. Preferably, the frequency change $\Delta f$ is proportional to the magnitude of the transverse expansion Q. Thus, the frequency change $\Delta f = Q*K_f*(f^2*\eta/n*D)$ may be a function of a plurality of parameters. The frequency change $\Delta f$ may, thus, also be proportional to a force sensitivity $K_f$. The force sensitivity $K_f$ itself is dependent on a force application angle $\theta$. D denotes a dimension parameter such as a diameter in the transverse plane BC of the piezoelectric material 21 while $\eta$ represents a device parameter. Preferably, quartz is used as the piezoelectric material 21 of the resonator element 20 with the orthogonal axes x, y, z being the crystal axes and the z axis being the optical axis. The resonator element 20 is cut as a y-disc in which the y axis is the normal to a plane zx and having a piezoelectric modulus $e_{26}$ and an elastic modulus cs. The y axis of the y-disc is parallel to the longitudinal axis AA'. The optical axis z of the y-disc extends in the transverse plane BC. It is also possible to use an AT disc instead of a y-disc as the resonator element 20. The AT disc is cut in a plane z'x having an angle of 35.25° between the z axis and an axis z'. Those skilled in the art knowing the present invention may use other known cuts in piezoelectric crystal material such as a CT cut, GT cut, BT cut, DT cut, FT cut, etc.

In the embodiments as shown in FIGS. 2, 3, 6, 7, the measurement transducer 1 comprises a single piezoelectric transducer element 10. The resonator element 20 is arranged in the piezoelectric transducer element 10 as seen along the longitudinal axis AA'. The resonator element 20 is spatially arranged between a first piezoelectric material 11 and a second piezoelectric material 11' of the piezoelectric transducer element 10.

In the embodiments as shown in FIGS. 4, 5, 8, 9, the measurement transducer 1 comprises two piezoelectric transducer elements 10, 10'. The resonator element 20 is arranged between a first piezoelectric transducer element 10 and a second piezoelectric transducer element 10' as seen along the longitudinal axis AA'. The resonator element 20 is arranged spatially between a first piezoelectric material 11 of the first piezoelectric transducer element 10 and a second piezoelectric material 11' of the second piezoelectric transducer element 10'. Thus, the sensitivity for the direct piezoelectric effect of the measurement transducer 1 comprising two piezoelectric transducer elements 10, 10' is higher, preferably twice as high, as compared to that of the measurement transducer 1 comprising only one piezoelectric transducer element 10.

To introduce the force F into the piezoelectric transducer element 10, 10' and the resonator element 20 in a substantially symmetrical manner the measurement transducer 1 has a symmetrical construction along the longitudinal axis AA'. In the embodiments as shown in FIGS. 2 to 9, the resonator element 20 is arranged between a first piezoelectric material 11 and a second piezoelectric material 11' in the direction of the longitudinal axis AA'. Preferably, the first piezoelectric material 11 and the second piezoelectric material 11' are identical parts which renders the production of the measurement transducer 1 cost-effective. In the embodiments as shown in FIGS. 2, 3, 6, 7, the second piezoelectric material 11' is mechanically connected to the piezoelectric material 21 of the resonator element 20. This mechanical connection is preferably achieved by means of material bonding such as welding, diffusion bonding, thermocompression bonding, soldering, etc. Such material bond can be made in a cost-effective manner and exhibits high long-term mechanical stability.

Resonator element 20 is cylindrical in shape along the longitudinal axis AA' and is arranged between a hollow cylindrical first piezoelectric material 11 and a hollow cylindrical second piezoelectric material 11'. A first cavity 33 is formed within the hollow cylinder of the first piezoelectric material 11 and a second cavity 33' is formed within the hollow cylinder of the second piezoelectric material 11'. Cavities 33, 33' are positioned above and below the resonator element 20. A spatial dimension of the cavities 33, 33' along the longitudinal axis AA' and in the transverse plane BC is greater than the amplitudes of the mechanical oscillations of the resonator element 20. Thus, the resonator element 20 has sufficient space to oscillate in the cavities 33, 33' with a high Q factor. The mechanical oscillations may occur axially along the longitudinal axis AA'. The mechanical oscillations may occur radially in the transverse plane BC. The mechanical oscillations may occur in the form of a thickness shear mode oscillation in the transverse plane BC. Finally, the mechanical oscillations may occur in the form of a combination of an axial and a radial oscillation or a combination of a radial oscillation and a thickness shear mode oscillation.

Figure 5:
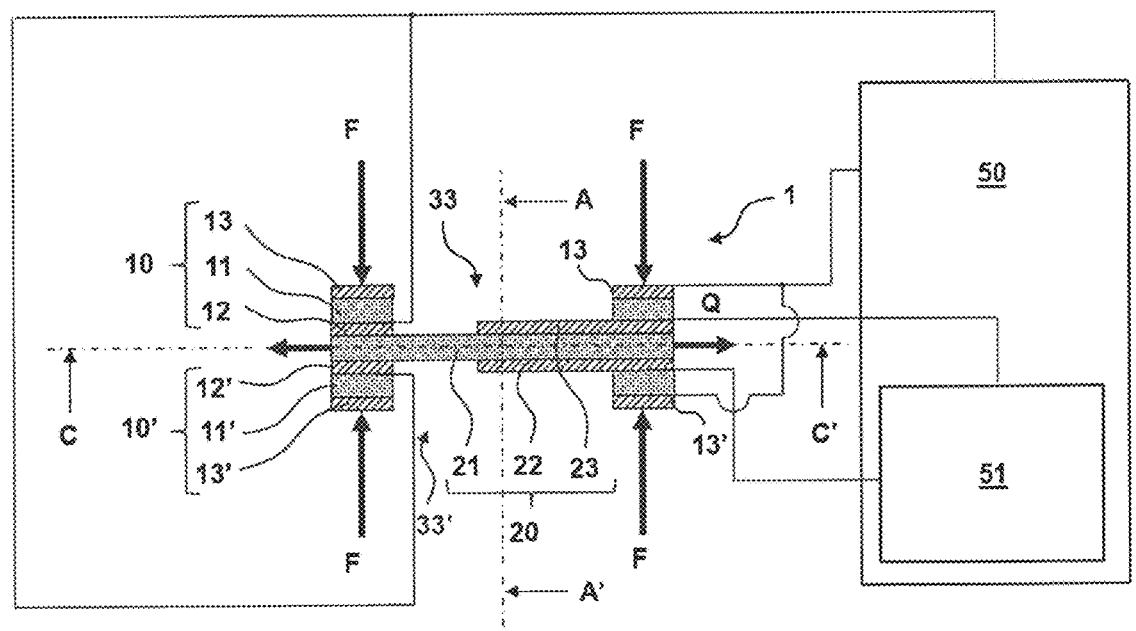
FIG. 5 shows a section through a portion of the second embodiment of a measurement transducer according to FIG. 4.

For measuring the force F, electrical polarization charges of the piezoelectric material 11, 11' of the piezoelectric transducer element 10, 10' are received by electrodes 12, 12', 13, 13' schematically shown in FIG. 5 for example and are transmitted as charge signals to an evaluation unit 50. Electrodes 12, 12', 13, 13' are referred to as the charge-receiving electrodes 12, 12', 13, 13'. For measuring the transverse expansion Q an alternating electrical field is applied as frequency signals to the piezoelectric material 21 of the resonator element 20 via electrodes 22, 23. The electrodes 22, 23 are also referred to as frequency electrodes 22, 23. Electrodes 12, 12', 13, 13', 22, 23 are thin layers of electrically conductive material such as pure metals, nickel alloys, cobalt alloys, iron alloys, etc. Electrodes 12, 12', 13, 13', 22, 23 are connected to the piezoelectric material 11, 11', 21 mechanically and electrically. Preferably, the mechanical and electrical connection is achieved by material bonding such as welding, diffusion bonding, thermocompression bonding, soldering, etc. Such material bond can be made in a cost-effective manner and exhibits high long-term mechanical and electrical stability.

The charge-receiving electrodes 12, 12', 13, 13' are hollow cylindrical in shape such as annular rings and extend substantially completely over end faces of the piezoelectric transducer element 10, 10'. The frequency electrodes 22, 23 are cylindrical in shape and extend into an oscillation area over end faces of the resonator element 20. The oscillation area is in a central region of the end faces of the resonator element 20, and this region is close to the longitudinal axis AA' that extends through the center of the end faces. Only narrow electrical leads to the frequency electrodes 22, 23 are arranged in a peripheral region of the end surfaces of the resonator element 20 and are spaced apart from the longitudinal axis AA' in a radial direction. In the oscillation area of the resonator element 20, the piezoelectric material 21 is excited by the electric currents supplied via the frequency electrodes 22, 23 to generate mechanical oscillations, and the resonator element 20 oscillates with a relatively higher amplitude than the amplitude of oscillations of the resonator element 20 in the more peripheral regions of the resonator element 20. In the peripheral region of the resonator element 20 is the resonator contact area K2, K2' where the force F is introduced into the resonator element 20. In the peripheral region of the resonator element 20, the piezoelectric material 21 is not excited by the frequency electrodes 22, 23 to mechanically oscillate, and the resonator element 20 oscillates at a relatively lower amplitude than the amplitude of oscillations of the resonator element 20 in the more central regions of the resonator element 20, and thus a magnitude of the amplitude of oscillations of the resonator element 20 decreases with increasing radial distance from the longitudinal axis AA'. A radial dimension of the peripheral region is chosen so that the mechanical oscillations are not or only to a negligible extent dampened by a mechanical connection of the piezoelectric transducer element 10, 10' and the resonator element 20.

Figure 2:
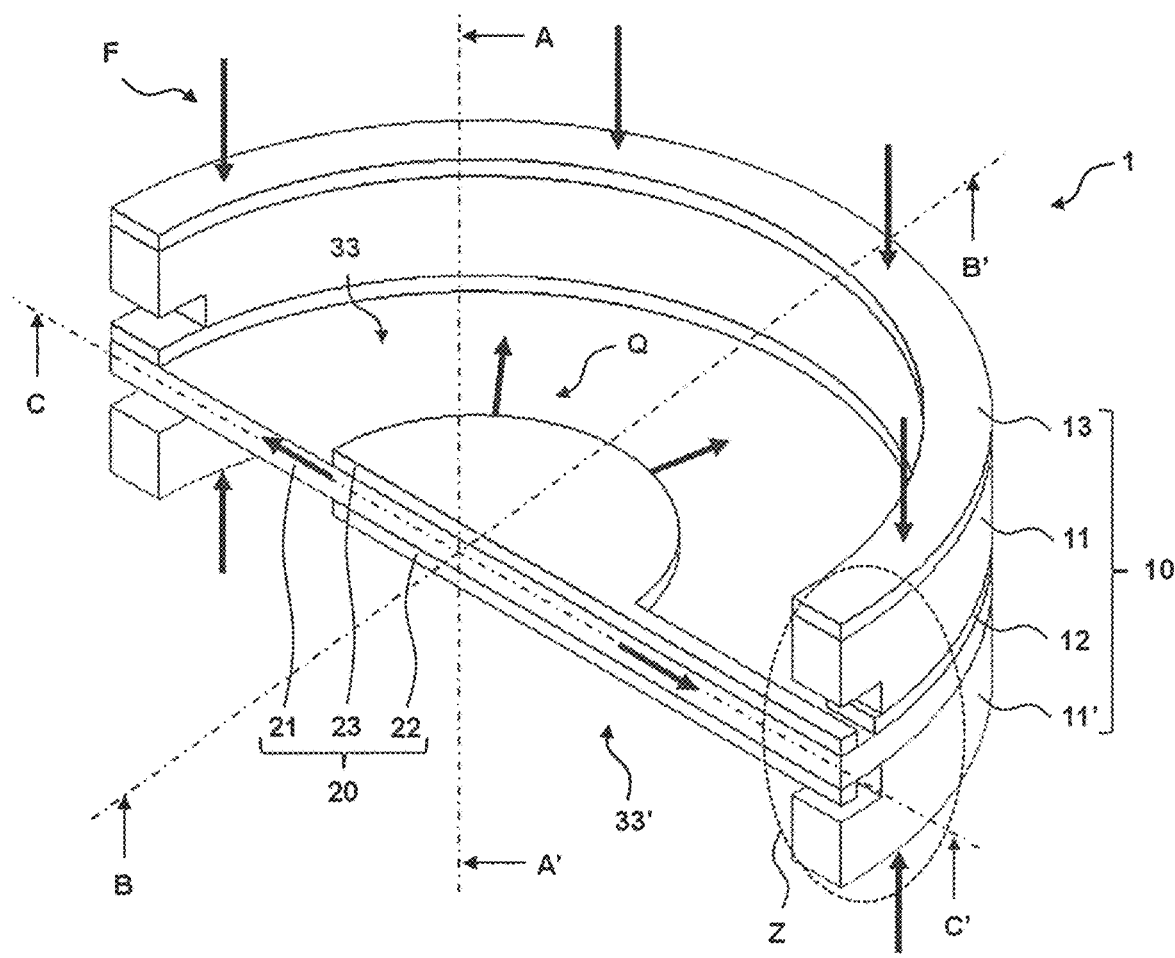
FIG. 2 is a perspective view of a portion of a first embodiment of the measurement transducer according to FIG. 1 comprising one piezoelectric transducer element.
Figure 3:
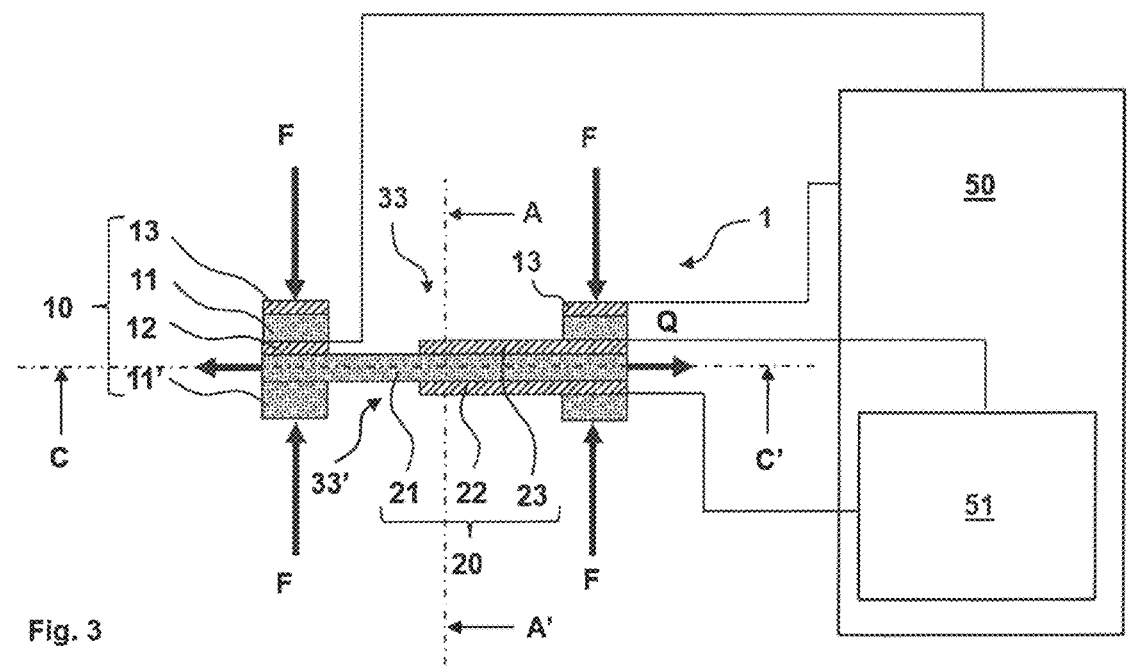
FIG. 3 shows a section through a portion of the first embodiment of a measurement transducer according to FIG. 2.

The first and third embodiments according to FIGS. 2, 3, 6, 7 comprise four electrodes 12, 13, 22, 23, the second and fourth embodiments of FIGS. 4, 5, 8, 9 comprise six electrodes 12, 12', 13, 13', 22, 23. In the first embodiment as shown in FIGS. 2, 3, a charge-receiving electrode 12 is mechanically and electrically connected both to the first piezoelectric material 11 of the piezoelectric transducer element 10 and to the piezoelectric material 21 of the resonator element 20. The charge-receiving electrode 12 is also called the counter electrode 12. A charge-receiving electrode 13 is arranged on the first piezoelectric material 11 of the piezoelectric transducer element 10; and it serves as the electrical ground and is also called the ground electrode 13. The grounding element electrode 13 is electrically connected to a grounded housing 41 (FIG. 20) of the measurement transducer 1. In exactly one contacting zone Z close to the diagonal axis CC', the counter electrode 12 and frequency electrodes 22, 23 are easily accessible for electrical and mechanical contacting with electrical conductors. The measurement transducer 1 requires only three electrical conductors for four electrodes 12, 13, 22, 23.

Figure 4:
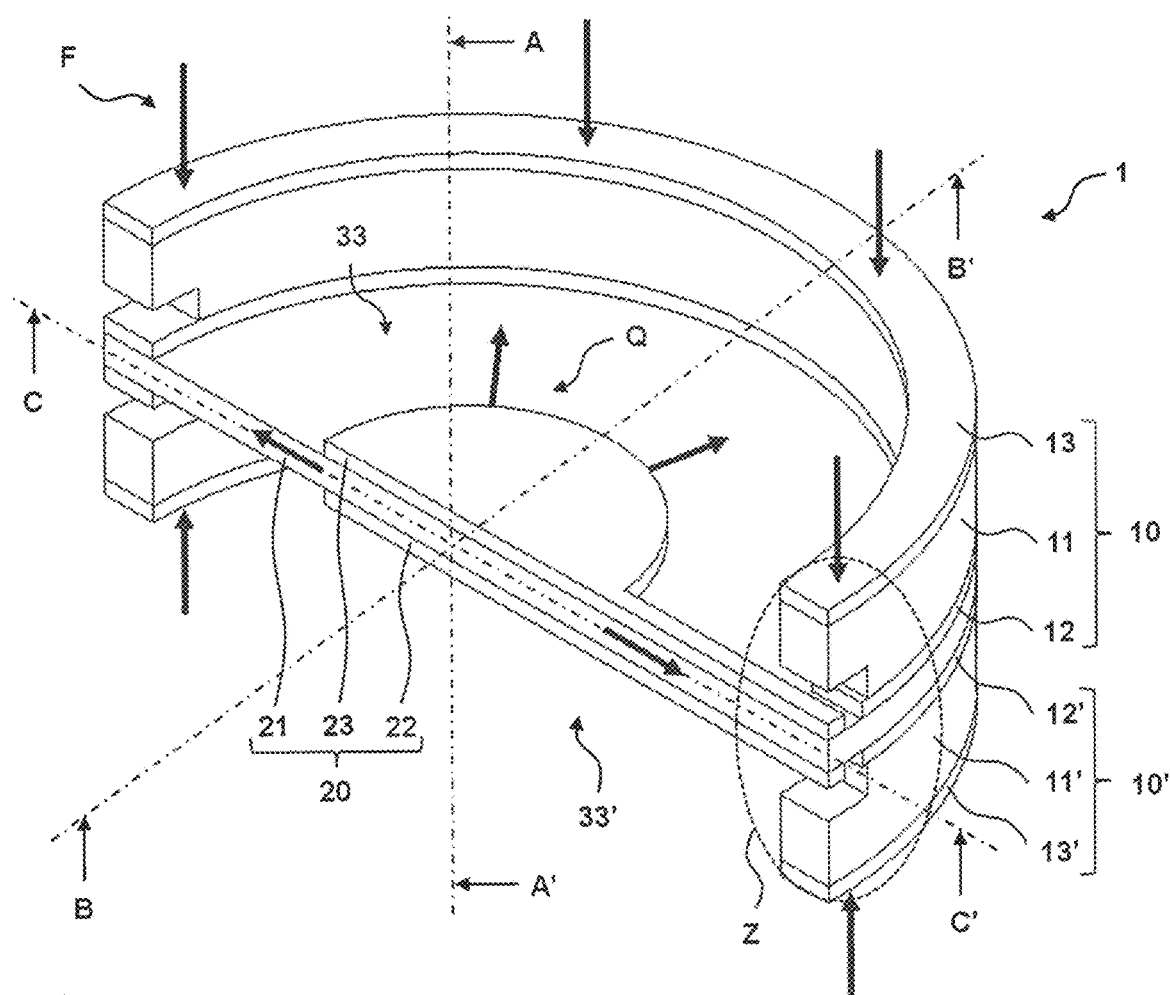
FIG. 4 shows a perspective view of a portion of a second embodiment of the measurement transducer according to FIG. 1 comprising two piezoelectric transducer elements.

In the second embodiment as shown in FIGS. 4, 5, two charge-receiving electrodes 12, 12' are mechanically connected to the piezoelectric material 21 of the resonator element 20. The two charge-receiving electrodes 12, 12' are arranged on different end faces of the piezoelectric material 21 of the resonator element 20. The two charge-receiving electrodes 12, 12' are electrically connected to one another and serve as a common counter electrode 12, 12'. The first piezoelectric material 11 of the first piezoelectric transducer element 10 and the second piezoelectric material 11' of the second piezoelectric transducer element 10' are arranged with opposite polarization direction with respect to each other so that the two counter electrodes 12, 12' receive electrical polarization charges of the same polarity. Two charge-receiving electrodes 13, 13' are arranged on the piezoelectric material 11, 11' of the piezoelectric transducer elements 10, 10' and serve as electrical ground and are also called the ground electrodes 13, 13'. The two grounding element electrodes 13, 13' are electrically connected to the grounded housing 41 (FIG. 20) of the measurement transducer 1. In exactly one contacting zone Z in the proximity of the diagonal axis CC' the common counter electrode 12, 12' and the frequency electrodes 22, 23 are easily accessible for electrical and mechanical contacting with electrical conductors. The measurement transducer 1 requires only three electrical conductors for six electrodes 12, 12', 13, 13', 22, 23.

Figure 6:
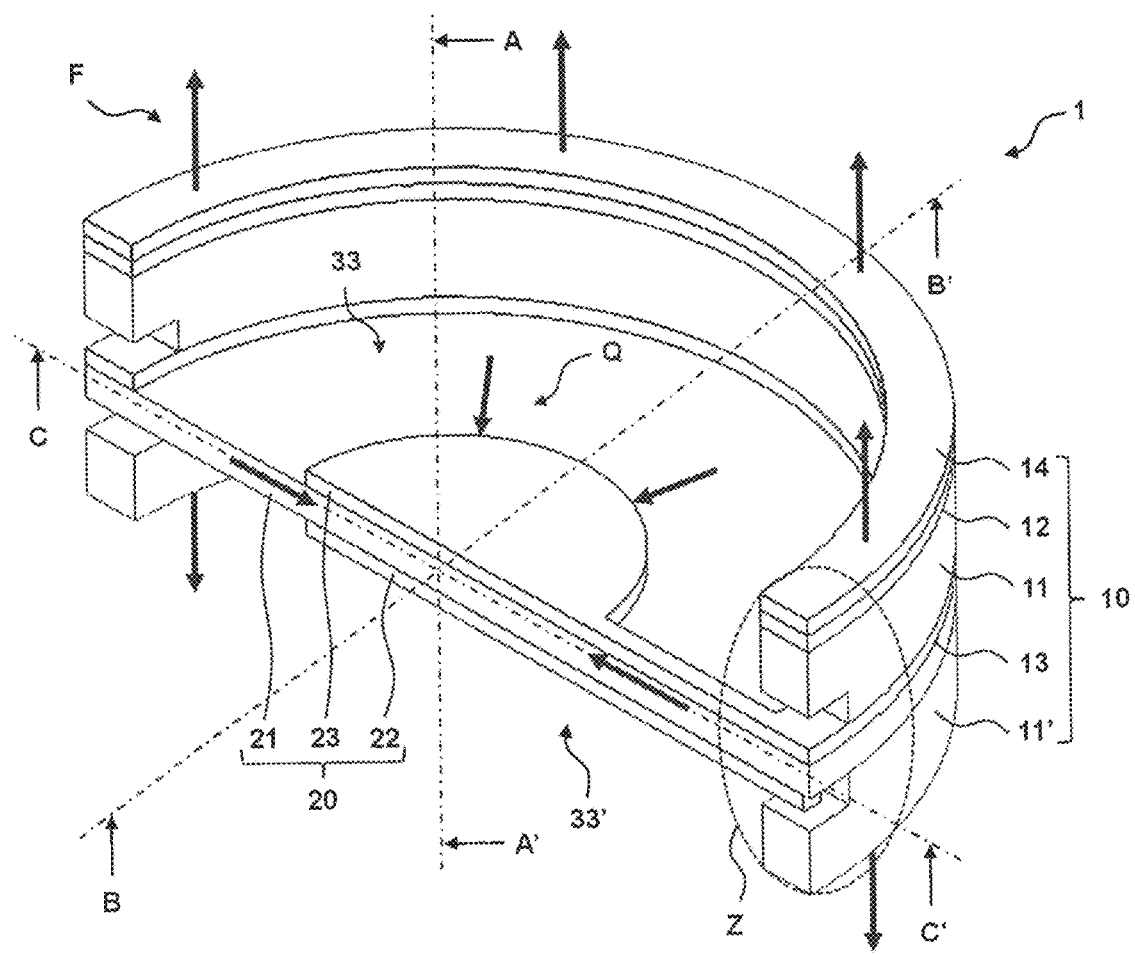
FIG. 6 is a perspective view of a portion of a third embodiment of the measurement transducer according to FIG. 1 comprising one piezoelectric transducer element.
Figure 7:
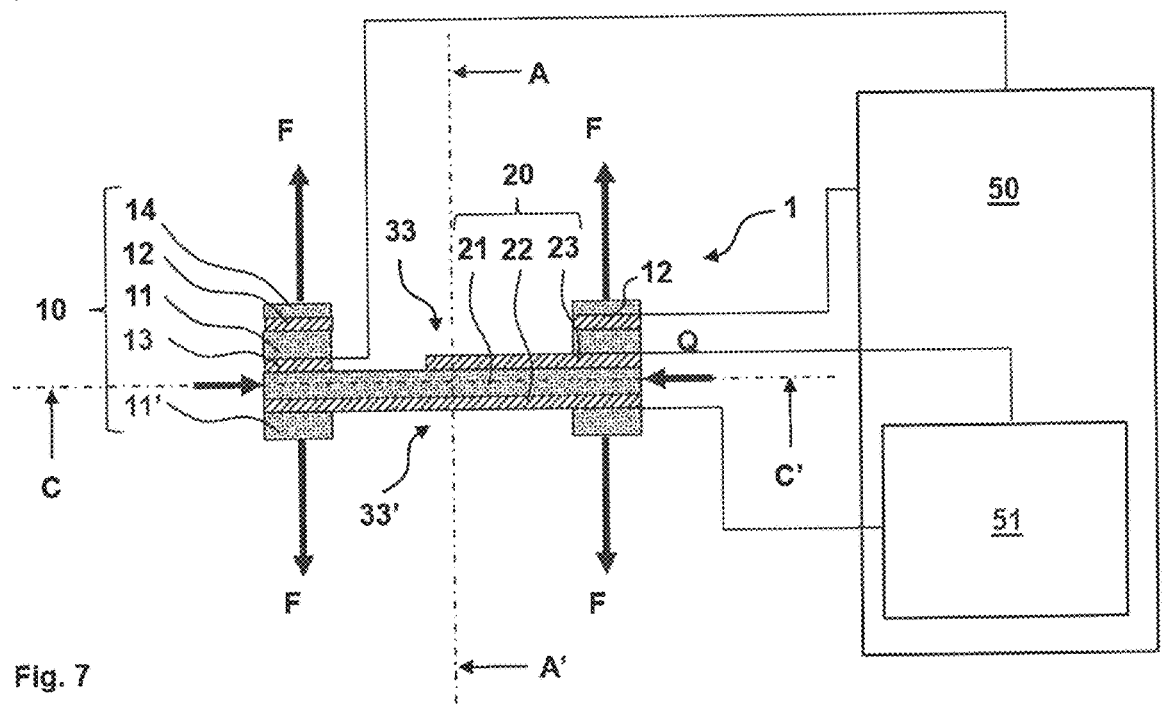
FIG. 7 shows a section through a portion of the third embodiment of a measurement transducer according to FIG. 6.

In the third embodiment as shown in FIGS. 6, 7, a charge-receiving electrode 13 is mechanically and electrically connected to both the first piezoelectric material 11 of the piezoelectric transducer element 10 and the piezoelectric material 21 of the resonator element 20. Charge-receiving electrode 13 is electrically connected to a frequency electrode 23. The two electrically connected electrodes 13, 23 serve as a common electrical ground and are also called the ground electrodes 13, 23. A charge-receiving electrode 12 is arranged on the piezoelectric material 11, 11' of the piezoelectric transducer element 10 and is also called the counter electrode 12. In exactly one contacting zone Z in the proximity of the diagonal axis CC' the ground electrodes 13, 23, counter electrode 12 and frequency electrode 22 are easily accessible for electrical and mechanical contacting with electrical conductors. The measurement transducer 1 requires only three electrical conductors for four electrodes 12, 13, 22, 23.

Figure 8:
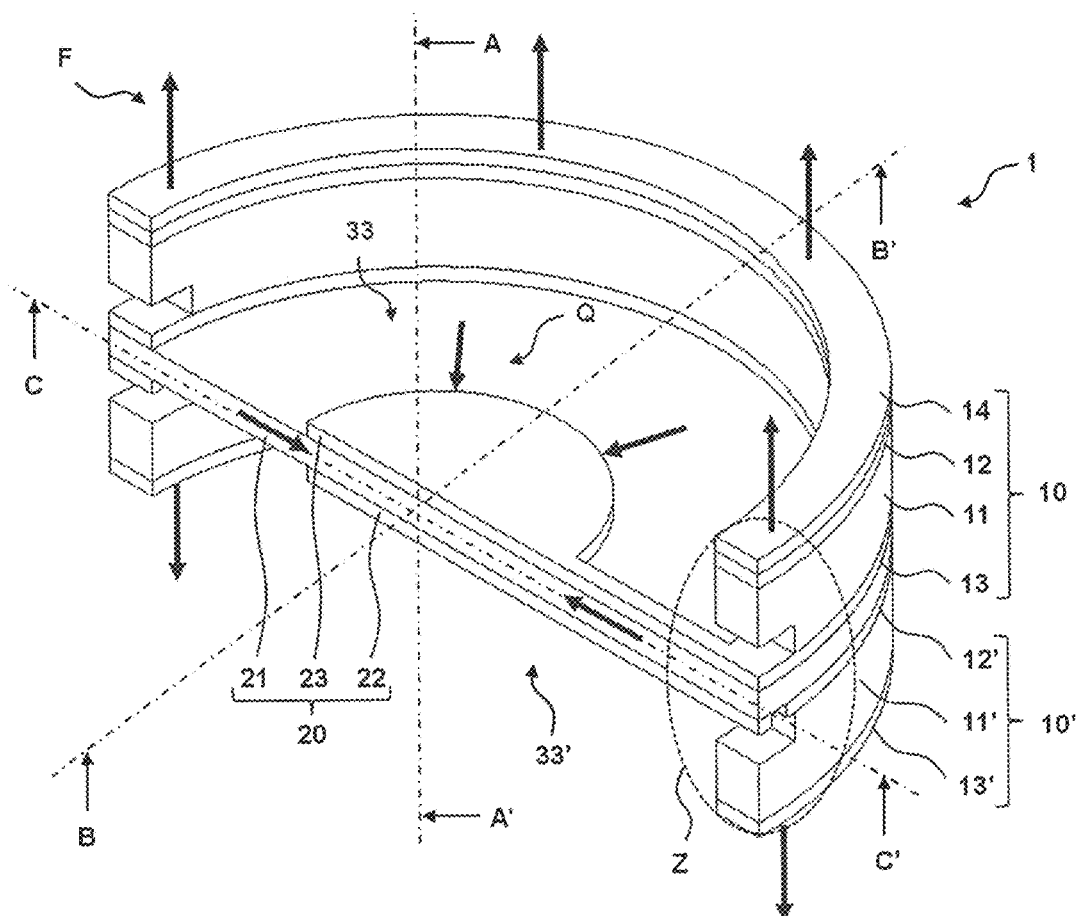
FIG. 8 is a perspective view of a portion of a fourth embodiment of the measurement transducer according to FIG. 1 comprising two piezoelectric transducer elements.
Figure 9:
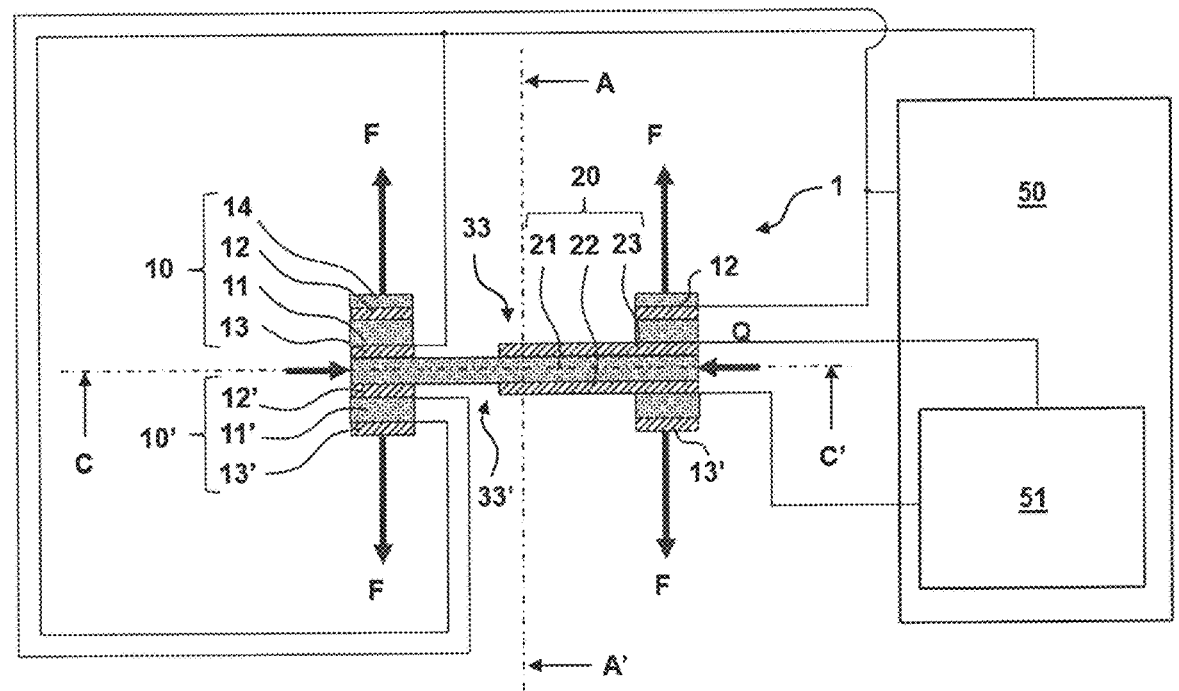
FIG. 9 shows a section through a portion of the fourth embodiment of a measurement transducer according to FIG. 8.

In the fourth embodiment as shown in FIGS. 8, 9, two charge-receiving electrodes 12', 13 are mechanically connected to the piezoelectric material 21 of the resonator element 20. The two charge-receiving electrodes 12', 13 are arranged on different end faces of the piezoelectric material 21. The two charge-receiving electrodes 12, 13' are arranged on the piezoelectric material 11, 11' of the piezoelectric transducer elements 10, 10'. A charge-receiving electrode 12' that is mechanically connected to the piezoelectric material 21 of the resonator element 20 and a charge-receiving electrode 12 that is arranged on the first piezoelectric material 11 of the first piezoelectric transducer element 10 are electrically connected to each other and serve as a common counter electrode 12, 12'. The first piezoelectric material 11 of the first piezoelectric transducer element 10 and the second piezoelectric material 11' of the second piezoelectric transducer element 10' are arranged with the same direction of polarization to one another so that the two counter electrodes 12, 12' receive electrical polarization charges of the same polarity. A charge-receiving electrode 13 that is mechanically connected to the piezoelectric material 21 of the resonator element 20 and a charge-receiving electrode 13' that is arranged on the second piezoelectric material 11' of the second piezoelectric transducer element 10' are electrically connected to each other and serve as an electrical ground and are also called the ground electrodes 13, 13'. The two grounding element electrodes 13, 13' are electrically connected to the grounded housing 41 (FIG. 20) of the measurement transducer 1. In exactly one contacting zone Z in the proximity of the diagonal axis CC' the ground electrode 13, counter electrode 12' and frequency electrodes 22, 23 are easily accessible for electrical and mechanical contacting with electrical conductors. The measurement transducer 1 requires only three electrical conductors for six electrodes 12, 12', 13, 13', 22, 23.

Construction of the measurement transducer 1 comprising three electrical conductors for four or six electrodes 12, 12', 13, 13', 22 and 23 is space-saving and provides for cost-effective production of the measurement transducer 1. The electrical and mechanical contacting of the electrodes 12, 12', 13, 13', 22, 23 with electrical conductors in exactly one contacting zone Z is achieved by means of material and/or friction bonding. The material bond is made by welding, diffusion welding, thermocompression, soldering, etc. while the friction bond is achieved by screw connection, clamp connection, etc. However, those skilled in the art knowing the present invention may also provide for electrical and mechanical contacting of the electrodes with electrical conductors in more than one contacting zone.

In the embodiments according to FIGS. 6 to 9, the measurement transducer 1 comprises an electrical insulation element 14. The electrical insulation element 14 is hollow cylindrical in shape. The electrical insulation element 14 is made of electrically insulating and mechanically rigid material such as ceramics, $Al_2O_3$ ceramics, sapphire, etc. The electrical insulation element 14 is mechanically connected to a counter electrode 12. Preferably, the mechanical connection is made by means of material bonding such as welding, diffusion bonding, thermocompression bonding, soldering, etc. Such material bond can be made in a cost-effective manner and exhibits high long-term mechanical stability.

An amplification and evaluation of the charge signals of the piezoelectric material 11 of the piezoelectric transducer element 10, 10' is performed in an evaluation unit 50. For this purpose, as schematically shown in FIGS. 3, 4, 7 and 9, the charge-receiving electrodes 12, 12', 13, 13' of the piezoelectric transducer element 10, 10' are electrically connected to an amplifier circuit of the evaluation unit 50. The piezoelectric material 21 of the resonator element 20 is excited by frequency signals from the evaluation unit 50. For this purpose, the frequency electrodes 22, 23 of the resonator element 20 are electrically connected to an oscillator circuit 51 of the evaluation unit 50. The frequency change $\Delta f$ is determined by the oscillator circuit 51. From the detected frequency change $\Delta f$, the evaluation unit 50 determines the transverse expansion Q. Preferably, the oscillator circuit 51 is a Colpitts circuit. Typical resonance frequencies are in the range of a few kHz up to several MHz, while typical frequency changes $\Delta f$ are in the range of 2 Hz/N to 100 Hz/N.

Figure 10:
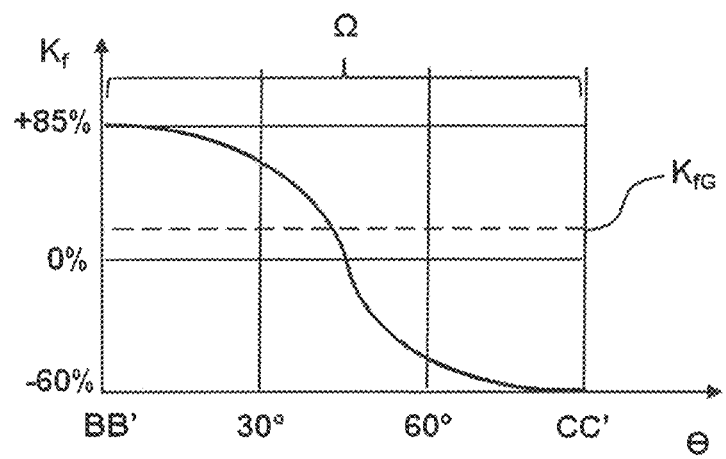
FIG. 10 shows a first illustration of a mean force sensitivity of a resonator element of the measurement transducer according to FIGS. 1 to 9 as a function of a force application angle.
Figure 11:
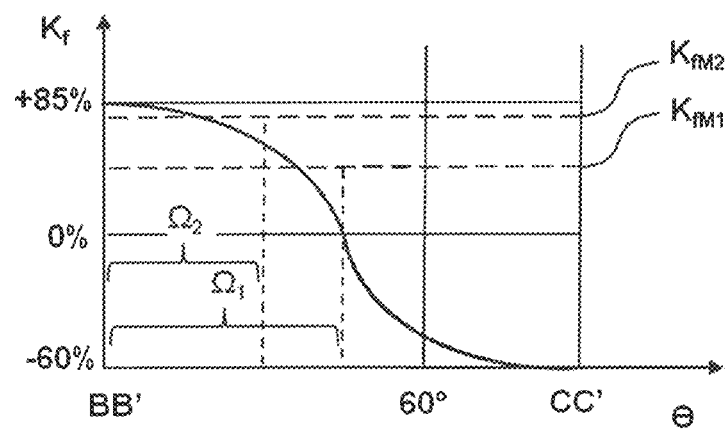
FIG. 11 shows a second illustration of the mean force sensitivity of a resonator element of the measurement transducer according to FIGS. 1 to 9 as a function of force application angle areas.

FIGS. 10 and 11 show the force sensitivity $K_f$ as a function of the force application angle 9. This force sensitivity $K_f$ applies to a resonator element 20 according to the embodiments as shown in FIGS. 1 to 9 oscillating in the cavity 33, 33'. For a force application angle 9 along the transverse axis BB' the force sensitivity $K_f$ is at a maximum and normalized to 100%. For a force application angle θ of 45° to the transverse axis BB' the force sensitivity $K_f$ is zero or 0%. For a force application angle 9 along the diagonal axis CC', the force sensitivity $K_f$ is at a minimum or 60%.

Referring to FIG. 10, if a force application angle area n extends over 90° from the transverse axis BB' to the diagonal axis CC' a sum of the force sensitivities $K_f$ results in a total force sensitivity $K_{fG}$ of 10%. A force application angle area n is limited in FIG. 11. For a first force application angle area $\Omega_1$ that covers 45° from the transverse axis BB' to the diagonal axis CC', then the sum of the force sensitivities $K_f$ results in a first mean force sensitivity $K_{fM1}$ of 50%. For a second force application angle area $\Omega_2$ that covers 30° from the transverse axis BB' to the diagonal axis CC', then the sum of the force sensitivities $K_f$ results in a second mean force sensitivity $K_{fM2}$ of 75%.

Figure 12:
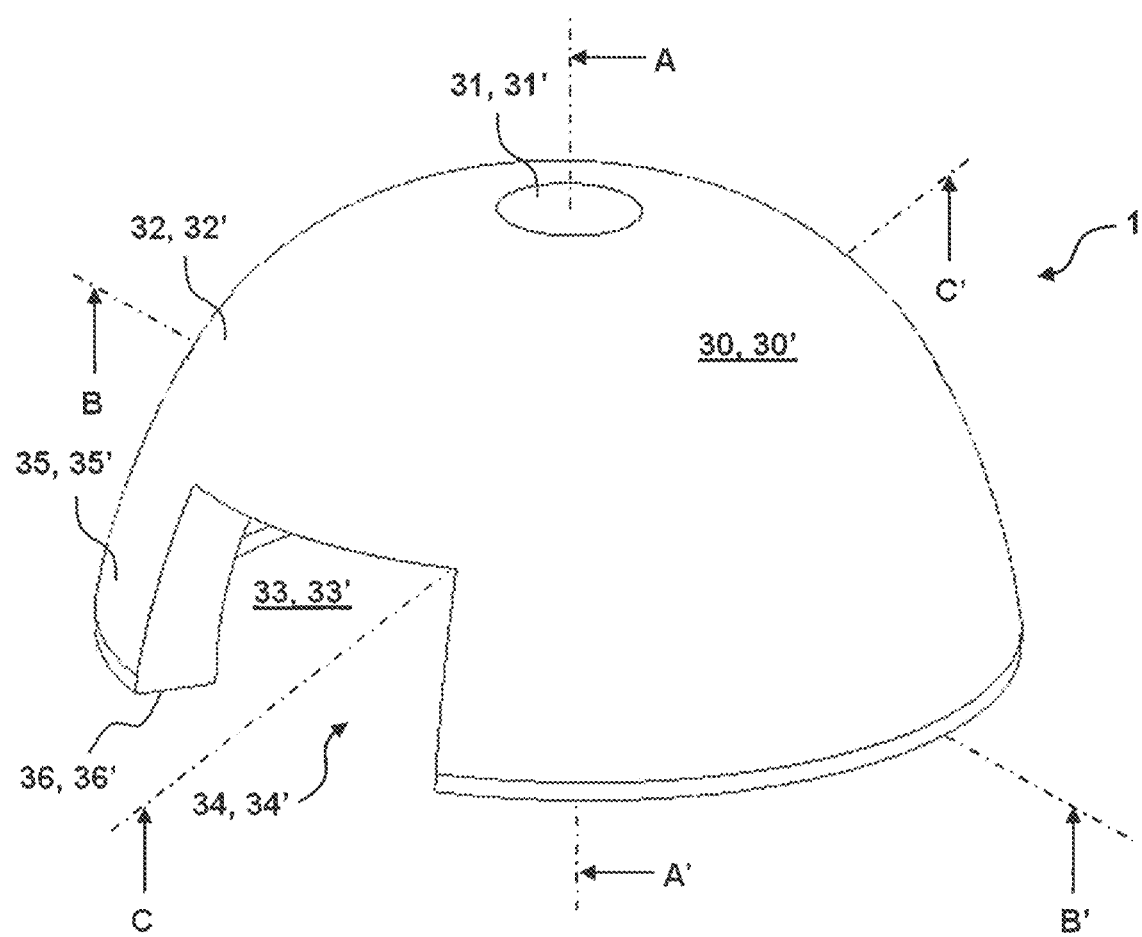
FIG. 12 shows a perspective view of a first embodiment of a force application element of the measurement transducer according to FIGS. 1 to 9.
Figure 13:
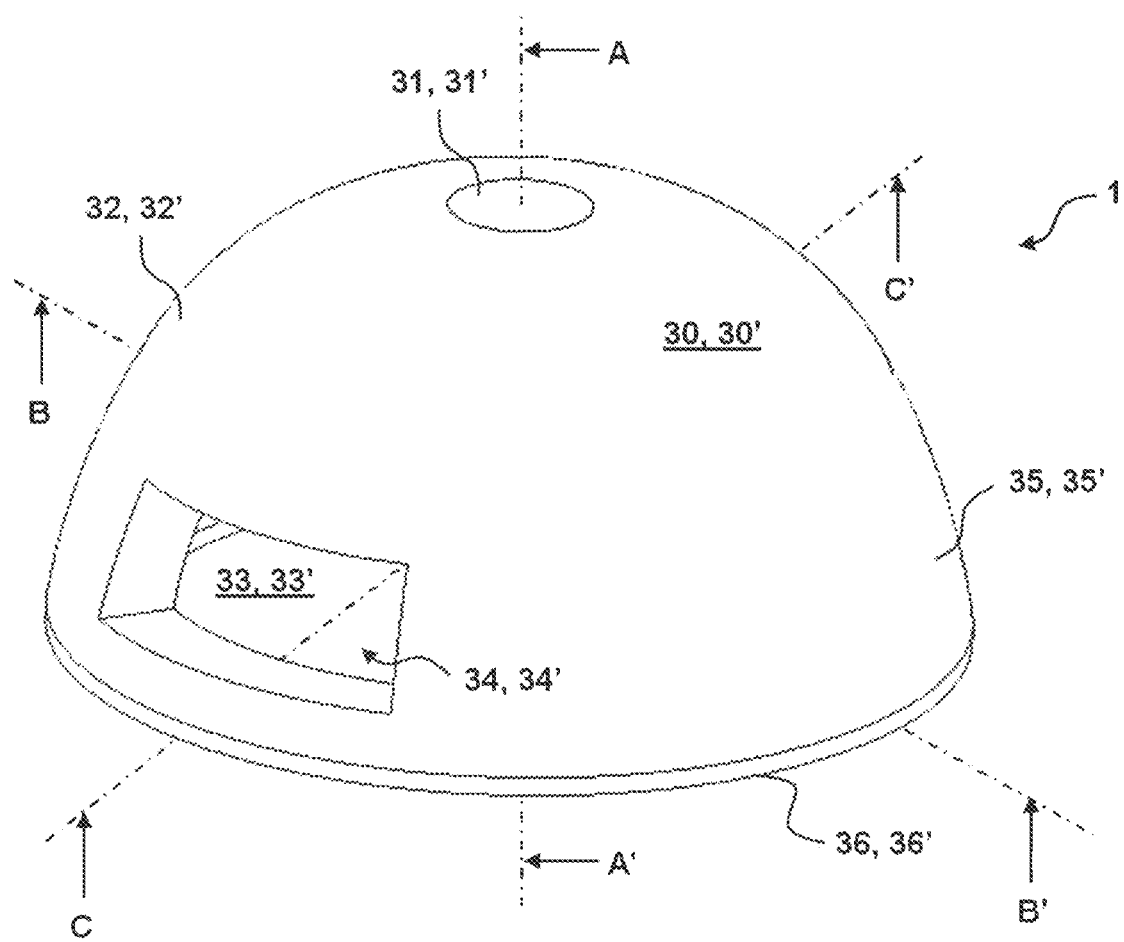
FIG. 13 shows a perspective view of a second embodiment of a force application element of the measurement transducer according to FIGS. 1 to 9.
Figure 14:
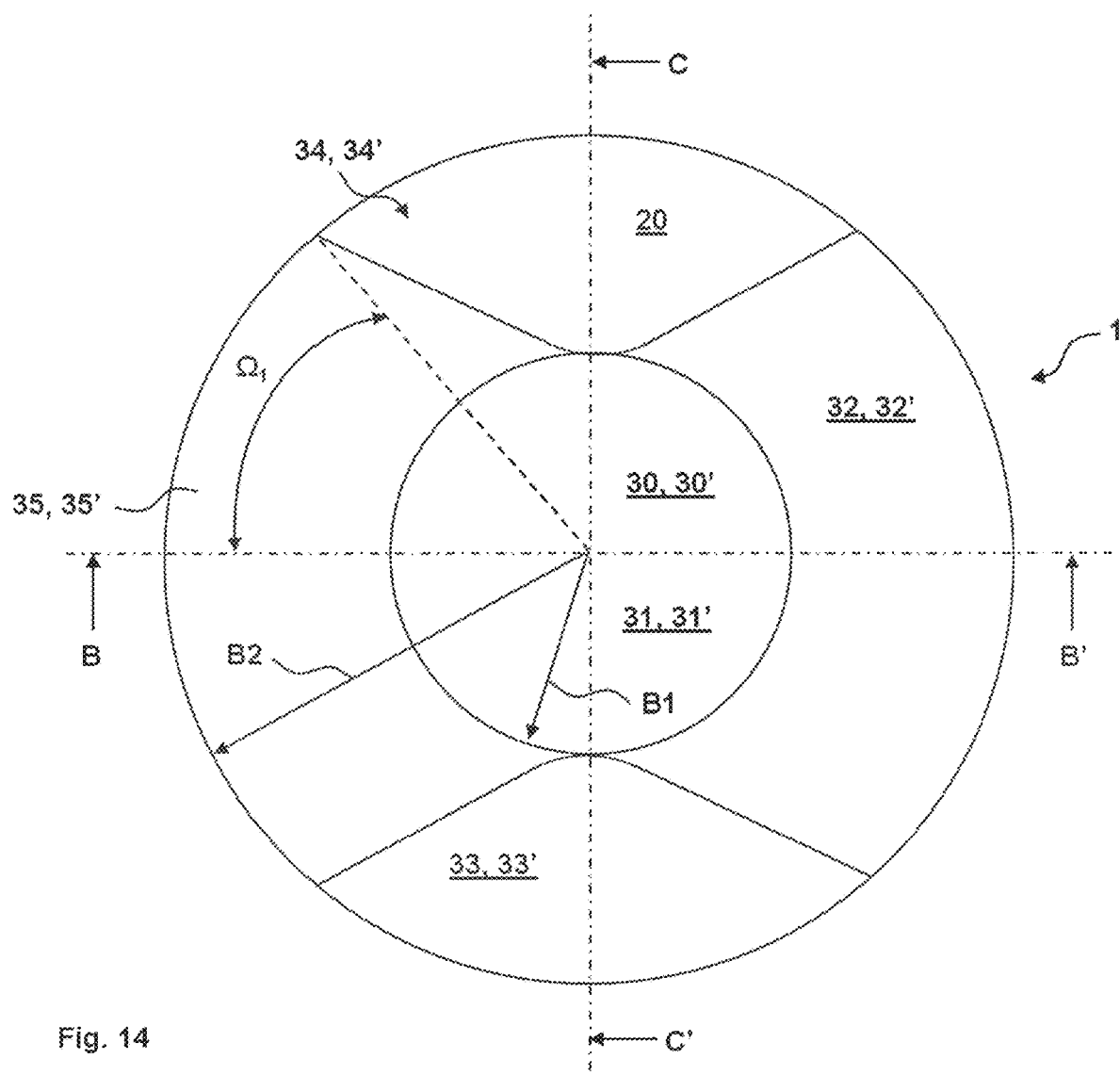
FIG. 14 shows a plan view of a third embodiment of a force application element of the measurement transducer according to FIGS. 1 to 9 with a first force application angle area.
Figure 15:
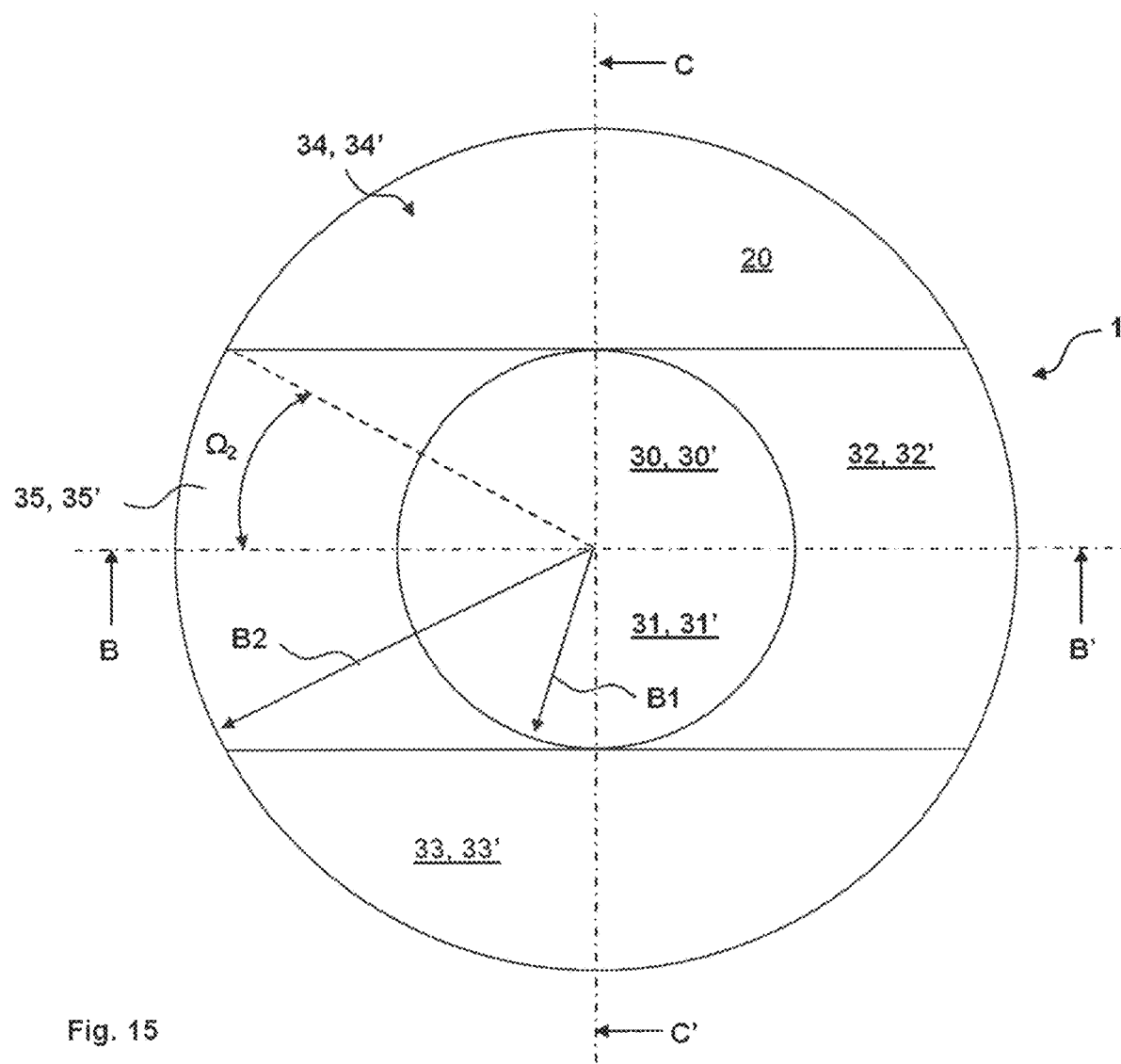
FIG. 15 shows a plan view of a fourth embodiment of a force application element of the measurement transducer according to FIGS. 1 to 9 with a second force application angle area.

Optimum adjustment of the force application angle area $\Omega$ can be achieved by means of at least one force application element 30, 30'. The force F acts on the force application element 30, 30' and is transmitted by the force application element 30, 30' into the piezoelectric transducer element 10, 10' and the resonator element 20. FIGS. 12 and 13 show a perspective view of first and second embodiments of a hollow spherical segment-shaped force application element 30, 30'. FIGS. 14 and 15 show a plan view of third and fourth embodiments of a hollow truncated cone-shaped force application element 30, 30'. The force application element 30, 30' may also be hollow cylindrical, hollow truncated pyramidal in shape, etc. The force application element 30, 30' consists of mechanically rigid material such as pure metals, nickel alloys, cobalt alloys, iron alloys, ceramics, etc.

The force application element 30, 30' is a hollow body comprising a top surface 31, 31', a lateral surface 32, 32' and a cavity 33, 33'. The resonator element 20 is arranged in the cavity 33, 33'. The cavity 33, 33' lies both in the force application element 30, 30' and in the piezoelectric transducer element 10, 10'. The top surface 31, 31' and lateral surface 32, 32' are mechanically connected to each other and enclose the cavity 33, 33'. The force F acts along the longitudinal axis AA' onto the top surface 31, 31' and is transmitted from the top surface 31, 31' into the lateral surface 32, 32'. The lateral surface 32, 32' comprises at least one recessed area 34, 34' which extends into the cavity 33, 33' and prevents the transmission of the force F in the lateral surface 32, 32'. In addition, the lateral surface 32, 32' comprises at least one non-recessed area 35, 35', and it is only this non-recessed area 35, 35' that transmits the force F. The hollow body comprises a base 36, 36' at an opposite end from the top surface 31, 31'. The top surface 31, 31' and base 36, 36' are mechanically connected to each other by the lateral surface 32, 32'. The top surface 31, 31', lateral surface 32, 32' and base 36, 36' are preferably made of one piece. The top surface 31, 31' and base 36, 36' are parallel to each other in the transverse plane BC. As schematically shown in FIGS. 14 and 15 for example, the non-recessed area 35, 35' of the lateral surface 32, 32' forms at least one force transmission angle area $\Omega$, $\Omega_1$, $\Omega_2$ with the base 36, 36' in the transverse plane BC.

The recessed area 34, 34' is preferably formed like a window. In the embodiment according to FIG. 12, the recessed area 34, 34' is arranged in a lower region of the lateral surface 32, 32' as seen along the longitudinal axis AA'. In the embodiment according to FIG. 13, the recessed area 34, 34' is arranged in a central region of the lateral surface 32, 32' as seen along the longitudinal axis AA'. In the two embodiments according to FIGS. 14 and 15, the recessed area 34, 34' corresponds to a large portion of the lateral surface 32, 32'. In the third embodiment according to FIG. 14, the force application element 30, 30' comprises four first force application angle areas (1 each covering 45°. In the fourth embodiment according to FIG. 15, the force application element 30, 30' comprises four second force application angle areas $\Omega_2$ each covering 30°. In both cases two first or second force application angle areas $\Omega_1$, $\Omega_2$ are delimited by a recessed area 34, 34' so that the force F is transmitted only by the first or second force application angle areas $\Omega_1$, $\Omega_2$. Preferably, each force application element 30, 30' comprises two recessed areas 34, 34' that are rotated by an angle of 180° with respect to each other as seen along the longitudinal axis AA'.

The first or second force application angle area $\Omega_1$, $\Omega_2$ is limited in certain areas so that, in total, a mean force sensitivity $K_{fM1}$, $K_{fM2}$ is close to the maximum of 100% of the force sensitivity $K_f$. The smaller the first or second force application angle area $\Omega_1$, $\Omega_2$, then the greater is a local pressure in the piezoelectric transducer element 10, 10' and in the resonator element 20. The size of the first or second force application angle area $\Omega_1$, $\Omega_2$ and, thus, the magnitude of the local pressure in the piezoelectric transducer element 10, 10' and in the resonator element 20, may be selected as a function of the compressive strength of the piezoelectric transducer element 10, 10' and the resonator element 20. The more pressure-resistant the piezoelectric transducer element 10, 10' and the resonator element 20 are, then the smaller the first or second force application angle area $\Omega_1$, $\Omega_2$ may be selected, and the higher will be the mean force sensitivity $K_{fM1}$, $K_{fM2}$.

Figure 16:
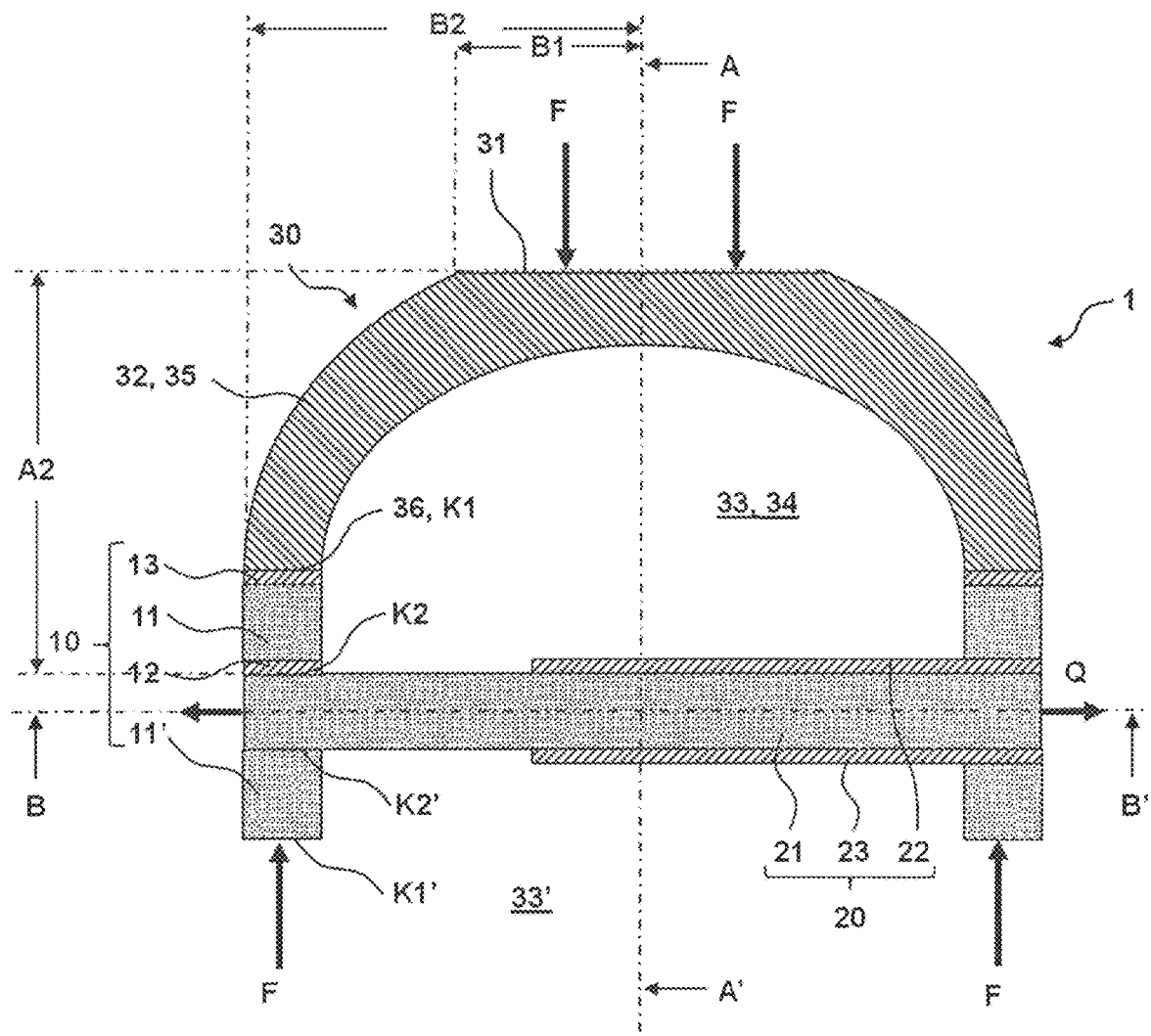
FIG. 16 shows a section through a portion of the measurement transducer according to FIG. 2 or 3 comprising a force application element according to FIG. 14 or 15.
Figure 17:
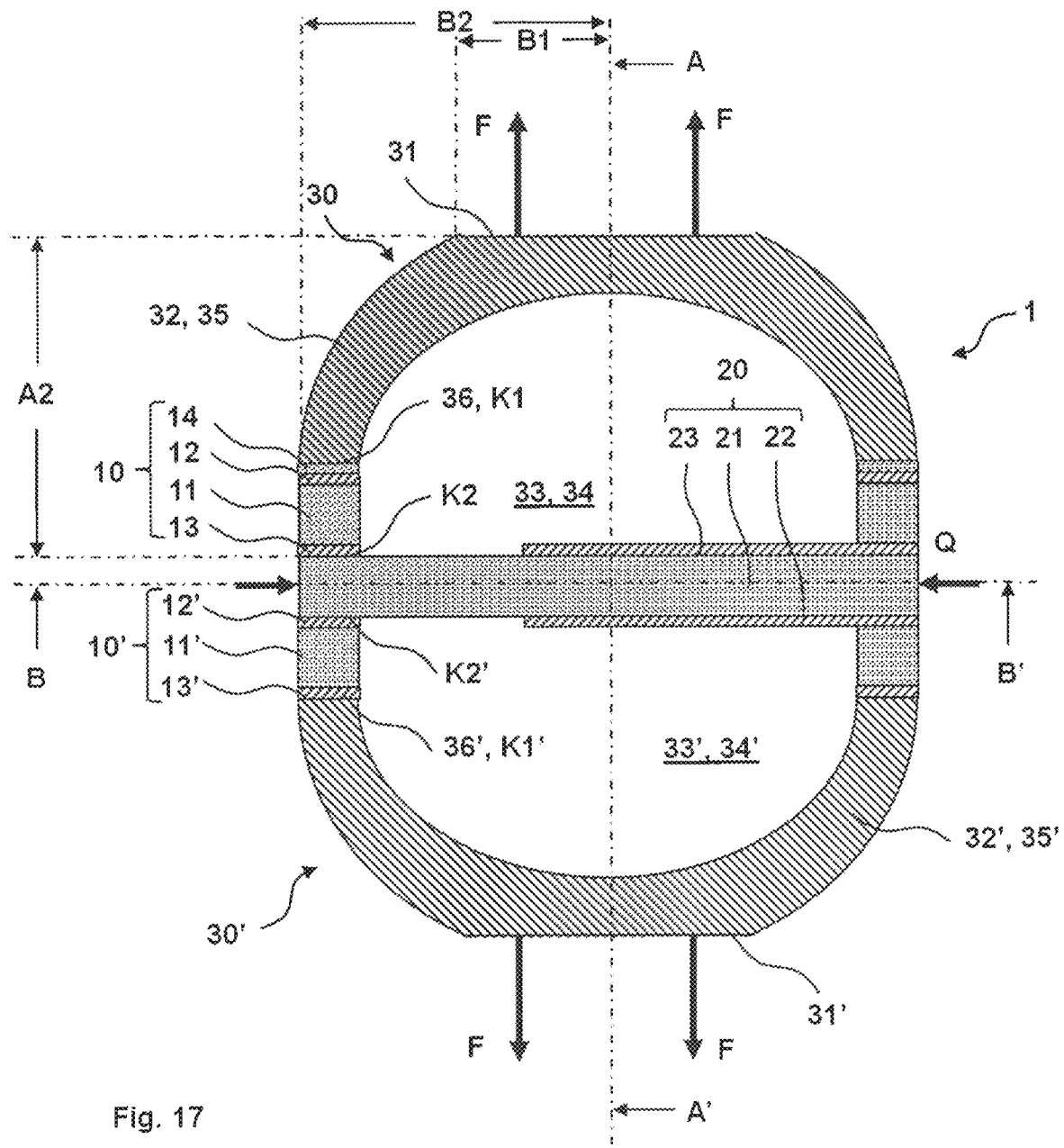
FIG. 17 shows a section through a portion of the measurement transducer according to FIG. 8 or 9 comprising two force application elements according to FIG. 14 or 15.

FIG. 16 shows a cross-section of the measurement transducer 1 according to FIGS. 2 and 3 comprising one force application element 30 according to FIG. 14 or 15. FIG. 17 shows a cross-section of the measurement transducer 1 according to FIGS. 8 and 9 comprising two force application elements 30, 30 according to FIG. 14 or 15. Preferably, the two force application elements 30, 30' are identical parts, said identical parts transmitting the force F symmetrically to the piezoelectric transducer element 10, 10' and the resonator element 20.

The piezoelectric transducer element 10, 10' and the resonator element 20 are mechanically connected to the lateral surface 32, 32', preferably by an indirect mechanical connection. Thus, in the embodiments as shown in FIGS. 16 and 17, the piezoelectric transducer element 10, 10' is mechanically connected to the force application element 30, 30' indirectly by the transducer contact area K1, K1' and the base 36, 36'. Furthermore, in the embodiments as shown in FIGS. 16 and 17 there is another indirect mechanical connection via the resonator contact area K2, K2' of the resonator element 20 to the piezoelectric transducer element 10, 10' which is in turn mechanically connected to the force application element 30, 30' by the transducer contact area K1, K1' and the base 36, 36'. Preferably, the mechanical connection is achieved by means of material bonding such as welding, diffusion bonding, thermocompression bonding, soldering, etc.

Referring to FIG. 16, the force F acts both on a first force application element 30 and on the piezoelectric transducer element 10. In this case, the force F acts on the piezoelectric transducer element 10 on the one hand indirectly via the first force application element 30, while the force F acts on the piezoelectric transducer element 10 on the other hand directly via a transducer contact area K1'. Referring to FIG. 17, the force F acts on the first force application element 30 and is transmitted via a first base 36 and the transducer contact area K1 into the first piezoelectric transducer element 10; and the force F acts on a second force application element 30' and is transmitted via a second base 36' and the transducer contact area K1' into the second piezoelectric transducer element 10'. In this case shown in FIG. 17, the force F acts on both piezoelectric transducer elements 10, 10' indirectly over force application elements 30, 30'. In this way, the force F is transmitted into the resonator element 20 by the piezoelectric transducer element 10, 10'.

Top surface 31, 31' and base 36, 36' are parallel to each other in the transverse plane BC. The longitudinal axis AA' is perpendicular to the transverse plane BC. The top surface 31, 31' is preferably circular having a constant outer radius or maximum distance B1 of the top surface 31, 31' to the longitudinal axis AA'. Base 36, 36' is preferably annular having a constant outer radius or maximum distance B2 of the base 36, 36' to the longitudinal axis AA'. The maximum distance B2 is greater than the maximum distance B1. Thus, in the lateral surface 32, 32' the force F is transmitted away from the longitudinal axis AA'. Transmission of the force F occurs in a curved section of the non-recessed area 35, 35' of the lateral surface 32, 32'. Transmission of the force F occurs from the top surface 31, 31' towards the resonator contact area K2, K2'. A2 designates a length along the longitudinal axis AA' from the top surface 31, 31' to the resonator contact area K2, K2'. The force F acting on the top surface 31, 31' causes an increased transverse expansion Q in the resonator element 20. The greater a difference between the maximum distance B2 and the maximum distance B1, then the more the transverse expansion Q increases. Because the transverse expansion Q is increased, also the frequency change that is generated by the force F increases. When the static force is measured using the inverse piezoelectric effect, thus, the high sensitivity, which is a market requirement, is achieved.

Figure 18:
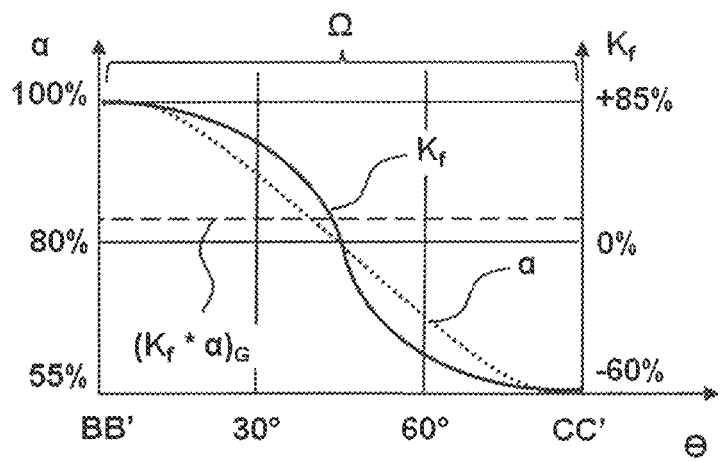
FIG. 18 shows a first illustration of a mean coefficient of linear thermal expansion of a resonator element of the measurement transducer according to FIGS. 1 to 9 as a function of a force application angle.

The fact that the force sensitivity $K_f$ is a function of the force application angle θ also has an impact on a magnitude of a coefficient of linear thermal expansion α of the piezoelectric material 11, 11', 21. As shown in FIG. 18, at maximum force sensitivity $K_f$ with a force application angle θ along the transverse axis BB', then the coefficient of linear thermal expansion α is at a maximum and is normalized to 100%. When the force sensitivity $K_f$ is at a minimum with a force application angle 9 along the diagonal axis CC', then the coefficient of linear thermal expansion α of the piezoelectric material 11, 11', 21 is at a minimum and is normalized to 55%. According to FIG. 18, in the whole force application angle area Q of 90° between the transverse axis BB' and the diagonal axis CC' transverse axis BB' towards the diagonal axis CC' results, in total, a total coefficient of linear thermal expansion $(K_f*α)_G$. The total coefficient of linear thermal expansion $(Kr*α)_G$ is the product of the force sensitivity $K_f$ and the coefficient of linear thermal expansion α summed up over all force application angles 8. However, if the force application angle area Ω is limited, in total, a resulting mean coefficient of linear expansion $(K_f*α)_{M1}$, $(K_f*α)_{M2}$ of the piezoelectric material 11, 11', 21 will vary depending on the size of a first or second force application angle area $Ω_1$, $Ω_2$. According to FIG. 19, for a first force application angle area $Ω_1$ covering 45° from the transverse axis BB' towards the diagonal axis CC' results in total a first mean coefficient of linear thermal expansion $(K_f*α)_{M1}$. For a second force application angle area $Ω_2$ covering 30° from the transverse axis BB' towards the diagonal axis CC' results in total a second mean thermal coefficient of linear thermal expansion $(K_f*α)_{M2}$.

Figure 19:
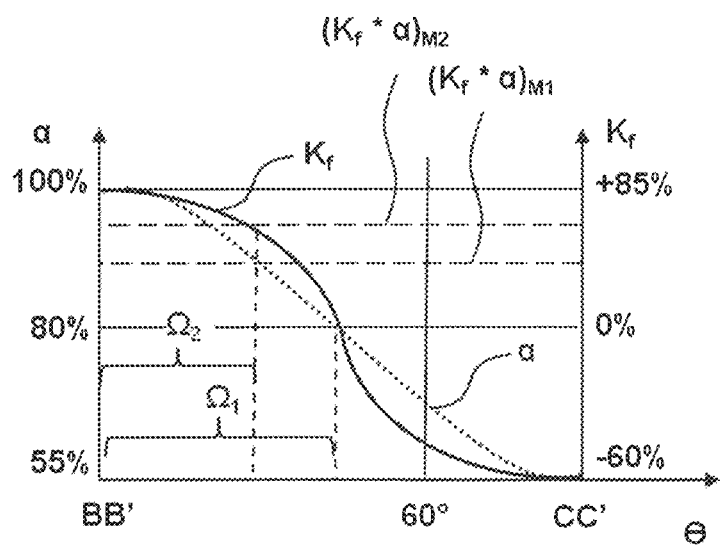
FIG. 19 is a second illustration of the mean coefficient of linear thermal expansion of a resonator element of the measurement transducer according to FIGS. 1 to 9 as a function of force application angle areas.

In operation, the measurement transducer 1 is permanently exposed to temperatures of 200° C. and higher. In this case, the linear expansions of the piezoelectric material 11, 11', 21 and the force application element 30, 30' may be different. The force application element 30, 30' has a coefficient of linear thermal expansion $α_{30}$. For comparing the coefficient of linear thermal expansion $α_{30}$ to the mean coefficients of linear thermal expansion $(Kr*α)_{M1}$, $(K_f*α)_{M2}$, the mean coefficients of linear thermal expansion $(K_f*α)_{M1}$, $(K_f*α)_{M2}$ according to FIG. 19 are weighted with the mean force sensitivities $K_{fM1}$, $K_{fM2}$ according to FIG. 11. For the first force application angle area $Ω_1$, the piezoelectric material 11, 11', 21 has a first weighted coefficient of linear thermal expansion $α_{M1}=(K_f*α)_{M1}/K_{fM1}$. For the second force application angle area $Ω_2$, the piezoelectric material 11, 11', 21 has a second weighted coefficient of linear thermal expansion $α_{M2}=(K_f*α)_2/K_{fM2}$. To keep the differential linear expansions of the piezoelectric material 11, 11', 21 and the force application element 30, 30' as small as possible, the first or second weighted coefficient of linear thermal expansion $α_{M1}$, $α_{M2}$ of the piezoelectric material 11, 11', 21 will be substantially equal to the coefficient of linear thermal expansion α30 of the force application element 30, 30'. Preferably, quartz is used as the piezoelectric material 11, 11', 21 which has a maximum coefficient of linear thermal expansion α of $13.7*10^{-6}$ $K^{-1}$ that is normalized to 100% in FIGS. 18 and 19, and a minimum coefficient of linear thermal expansion α of $7.5*10^{-6}$ $K^{-1}$ corresponding to the normalization to 55% in FIGS. 18 and 19. A force application element 30, 30' made of steel has a coefficient of linear thermal expansion $α_{30}$ of $13.0*10^{-6}$ $K^{-1}$. For the first force application angle area $Ω_1=45°$, the piezoelectric material 11, 11', 21 has a first weighted coefficient of linear thermal expansion $α_{M1}=12*10^{-6}$ $K^{-1}$ while for the second force application angle area $Ω_1=30°$, the piezoelectric material 11, 11', 21 has a second weighted coefficient of linear thermal expansion $α_{M2}=13*10^{-6}$ $K^{-1}$ which is substantially equal to the coefficient of linear thermal expansion $α_{30}$ of the force application element 30, 30'.

The resonator element 20 measures a temperature T by means of the inverse piezoelectric effect. The resonance frequency of the piezoelectric material 21 of the resonator element 20 is dependent on a temperature T according to the following equation: $f(T)=1/2d(T)*(e_{iλ}(T)/ρ(T))^{1/2}$ wherein the piezoelectric modulus $e_{iλ}$, a material thickness d of the piezoelectric material 21 and a density ρ are dependent on the temperature T. The parameter $Δf_T$ denotes a temperature-dependent frequency change. The frequency change $Δf_T$ is detected by means of the oscillator circuit 51 of the evaluation unit 50. The evaluation unit 50 determines the temperature T from the detected temperature-dependent frequency change $Δf_T$. Preferably, quartz is used as the piezoelectric material 21 of the resonator element 20 having resonance frequencies in the range of a few kHz to several MHz and a temperature-dependent frequency change $Δf_T$ in the range of 20 Hz/K to 200 Hz/K.

Figure 20:
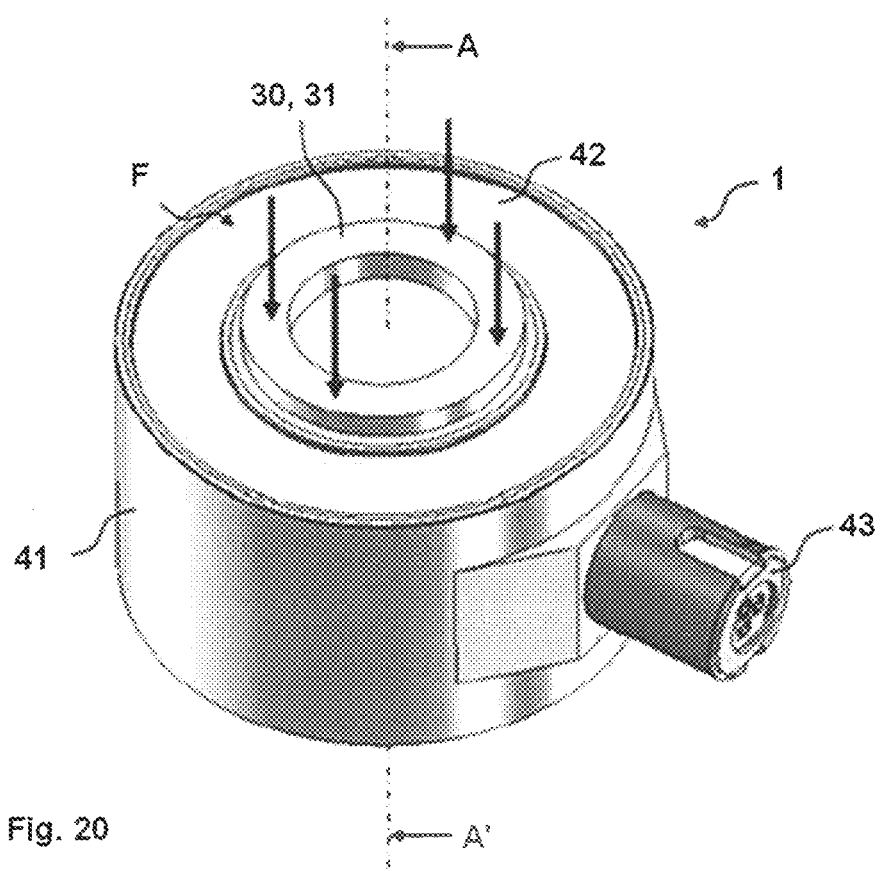
FIG. 20 is a view of an embodiment of a mounted ready-to-use measurement transducer according to FIGS. 1 to 9 comprising a force application element according to FIG. 14 or 15.

FIG. 20 shows the mounted ready-to-use measurement transducer 1 according to FIGS. 1 to 9 comprising a force application element 30, 30' according to FIGS. 14 to 17. The measurement transducer 1 is mounted in a housing 41 under vacuum. The housing 41 is cylindrical. At least one force application element 30, 30' protrudes from the housing 41 at an end face of the housing 41 with a top surface 31, 31'. Preferably, two force application elements 30, 30' protrude from the housing 41 at two end faces of the housing 41, each with a top surface 31, 31'. Only one end face is shown in the representation in FIG. 20. Each end face comprises a hollow cylindrical cover 42. The housing 41 and cover 42 protect the measurement transducer 1 from harmful external conditions such as dirt, moisture, mechanical impacts, etc. The housing 41 and cover 42 are made of mechanically resistant material such as pure metals, nickel alloys, cobalt alloys, iron alloys, etc. The force application element 30, 30' is mechanically connected to the housing 41 by the cover 42. The cover 42 is mechanically connected to the housing 41 at a radially outer edge with respect to the longitudinal axis AA'. Preferably, the mechanical connection is performed by material bonding such as welding, diffusion bonding, thermocompression bonding, soldering, etc. Cover 42 is mechanically connected to the force application elements 30, 30' via a radially inner edge with respect to the longitudinal axis AA'. Preferably, the mechanical connection is made by material bonding such as welding, diffusion bonding, thermocompression bonding, soldering, etc. The cover 42 is thin, the thickness of the cover 42 being 0.3 mm, preferably 0.2 mm, preferably 0.1 mm, to achieve a small force shunt towards the housing 41. The thinner the cover 42, the smaller is the force shunt towards the housing 41.

Charge signals of the charge-receiving electrodes 12, 12', 13 and 13' are transmitted by electrical conductors to an electrical connection 43 to the evaluation unit 50. Frequency signals from the evaluation unit 50 are transmitted via the electrical connection 43 by electrical conductors to the frequency electrodes 22, 23. The evaluation unit 50 may be electrically connected to the electrical connection 43 by a plug and cable (not shown). The electrical connection 43 is arranged in an opening of a side wall of the housing 41. The electrical connection 43 is mechanically connected to the housing 41. Preferably, the mechanical connection is made by means of material bonding such as welding, diffusion bonding, thermocompression bonding, soldering, etc.

Electrical and mechanical contacting of the electrodes 12, 12', 13, 13', 22 and 23 and the electrical conductors is easily accomplished in exactly one contacting zone Z. For this purpose, the measurement transducer 1 according to FIGS. 1 to 9 is electrically and mechanically contacted with stripped ends of the electrical conductors before it is inserted in the housing 41. Afterwards, the measurement transducer 1 is inserted in the housing 41 and the electrical conductors that are electrically and mechanically contacted with the measurement transducer 1 are led outside of the housing through the opening in the side wall of the housing 41 and are electrically and mechanically contacted to the electrical connection 43 by a material and/or frictional connection. The material bond is achieved by welding, diffusion welding, thermocompression, soldering, etc. The frictional connection is achieved by a screw connection, clamp connection, etc.

The mechanical connections between the housing 41 and the covers 42, between the covers 42 and the force application elements 30, 30' as well as between the housing 41 and the electrical connection 43 are pressure-tight.

LIST OF REFERENCE NUMERALS

A2 length
B1, b2 maximum distance
AA', BB', CC' axis
BC transverse plane
$K_f$ force sensitivity
$K_{fG}$ total force sensitivity
$K_{fM1}$, $K_{fM2}$ mean force sensitivity
$(K_f*\alpha)_G$ total coefficient of linear expansion
$(K_f*\alpha)_{M1}$, $(K_f*\alpha)_{M2}$ mean coefficient of linear expansion
F force
Q transverse expansion
K1, K1' transducer contact area
K2, K2' resonator contact area
Z contacting zone
$\alpha$ coefficient of linear expansion
$\theta$ force application angle
$\Omega$, $\Omega_1$, $\Omega_2$ force application angle area
1 measurement transducer
10, 10' piezoelectric transducer element
11, 11', 21 piezoelectric material
12, 12', 13, 13' charge-receiving electrode
14 electrical insulator element
20 resonator element
22, 23 frequency electrode
30, 30' force application element
31, 31' top surface
32, 32' lateral surface
33, 33' cavity
34, 34' recessed area
35, 35' non-recessed area
36, 36' base
41 housing
42 cover
43 electrical connection

The invention claimed is:

1. A measurement transducer for measuring a force that can include a dynamic component and a static component and that acts in a first direction along a load path, the measurement transducer comprising:
 a first piezoelectric transducer element defining element surfaces that are configured to generate electrical polarization charges proportional to a magnitude of the force acting in the first direction;
 a resonator element configured to be excited to at least one resonance frequency;
 wherein the resonator element is further configured so that in response to the force acting in the first direction the resonator element undergoes a transverse expansion that changes the resonance frequency of the resonator element as a function of the force acting in the first direction;
 wherein the first piezoelectric transducer element is configured to measure the dynamic component of the force directly in the load path while the resonator element is configured to measure the transverse expansion caused by the static component of the force in an oscillation region that lies outside the load path;
 wherein the transverse expansion proceeds in a transverse direction that forms a non-zero angle relative to the first direction; and
 wherein the transverse expansion has a magnitude that is proportional to the magnitude of the force acting in the first direction.

2. The measurement transducer according to claim 1, wherein the first piezoelectric transducer element includes a first piezoelectric material and a second piezoelectric material; and wherein the resonator element is spatially arranged between the first piezoelectric material and the second piezoelectric material.

3. The measurement transducer according to claim 2, wherein the piezoelectric transducer element is oriented for the direct piezoelectric effect in the form of the longitudinal effect to occur so that electrical polarization charges are generated on those element surfaces on which the force acts in the first direction; and wherein each of the first piezoelectric material and the second piezoelectric material is oriented with respect to the force to have high sensitivity for the direct piezoelectric effect.

4. The measurement transducer according to claim 2, wherein the first piezoelectric material is hollow cylindrical in shape and forms a first cavity; the second piezoelectric material is hollow cylindrical in shape and forms a second cavity; and the resonator element is configured to oscillate in the cavities as a thickness oscillator or as a longitudinal mode oscillator or as an expansion oscillator or as a flexural mode oscillator or as a face shear mode oscillator or as a thickness shear mode oscillator.

5. The measurement transducer according to claim 1, further comprising a second piezoelectric transducer element that includes a second piezoelectric material; wherein the first piezoelectric transducer element includes a first piezoelectric material; and wherein the resonator element is spatially arranged between the first piezoelectric material and the second piezoelectric material.

6. The measurement transducer according to claim 5, wherein the piezoelectric transducer element is oriented for the direct piezoelectric effect in the form of the longitudinal effect to occur so that electrical polarization charges are generated on those element surfaces on which the force acts in the first direction; and wherein each of the first piezoelectric material and the second piezoelectric material is oriented with respect to the force to have high sensitivity for the direct piezoelectric effect.

7. The measurement transducer according to claim 5, wherein the first piezoelectric material is hollow cylindrical in shape and forms a first cavity; the second piezoelectric material is hollow cylindrical in shape and forms a second cavity; and the resonator element is configured to oscillate in the cavities as a thickness oscillator or as a longitudinal mode oscillator or as an expansion oscillator or as a flexural mode oscillator or as a face shear mode oscillator or as a thickness shear mode oscillator.

8. The measurement transducer according to claim 1, wherein the piezoelectric transducer element is hollow cylindrical in shape and the resonator element is cylindrical in shape.

9. The measurement transducer according to claim 1, wherein the piezoelectric transducer element comprises a first piezoelectric material and a second piezoelectric material; and the resonator element comprises a third piezoelectric material which is identical to the first piezoelectric material of the piezoelectric transducer element.

10. The measurement transducer according to claim 9, wherein the piezoelectric material of the piezoelectric transducer element and the resonator element consists of quartz; wherein an optical axis of the piezoelectric material of the piezoelectric transducer element is arranged parallel to an optical axis of the piezoelectric material of the resonator element; and the piezoelectric material of the piezoelectric transducer element and the piezoelectric material of the resonator element has similar elastic and thermal properties in a plane perpendicular to the optical axis.

11. The measurement transducer according to claim 10, wherein the piezoelectric material of the piezoelectric transducer element and of the resonator element is made of crystal material of an m, 32, 3m, $\bar{4}$2m, 2m or 23 symmetry class.

12. The measurement transducer according to claim 9, further comprising a plurality of charge-receiving electrodes, wherein each of the plurality of charge-receiving electrodes is configured to receive the electrical polarization charges; and a plurality of frequency electrodes, wherein each of the plurality of frequency electrodes is configured to apply an alternating electrical field to the third piezoelectric material of the resonator element; and wherein a first one of the plurality of charge-receiving electrodes is connected to the first piezoelectric material by material bonding, a second one of the plurality of charge-receiving electrodes is connected by material bonding to the second piezoelectric material of the piezoelectric transducer element, and the third piezoelectric material of the resonator element is connected to a third one of the plurality of charge-receiving electrodes by material bonding.

13. The measurement transducer according to claim 12, further comprising three electrical conductors configured for contacting the charge-receiving electrodes and the frequency electrodes; and wherein the charge-receiving electrodes and the frequency electrodes are electrically and mechanically contacted by the three electrical conductors in a contacting zone.

14. The measurement transducer according to claim 1, further comprising a housing that defines an end face, wherein the piezoelectric transducer element and the resonator element are mounted in the housing; a force application element protruding from the housing and defining a top surface on the end face of the housing.

15. The measurement transducer according to claim 14, further comprising a cover that connects the force application element mechanically to the housing; wherein said cover is thin to keep the force shunt to the housing low.

16. A measurement transducer for measuring a force that can include a dynamic component and a static component that that acts in a first direction along a load path, the measurement transducer comprising:

a first piezoelectric transducer element defining element surfaces that are configured to generate electrical polarization charges proportional to a magnitude of the force acting in the first direction;

a resonator element configured to be excited to at least one resonance frequency;

an oscillator circuit electrically connected to the resonator element and configured to apply an alternating electrical field to the piezoelectric material of the resonator element; and an evaluation unit electrically connected to the resonator element and configured to detect a frequency change ($\Delta f$) of a mechanical natural frequency of the piezoelectric material of the resonator element and determine the force from the detected frequency change ($\Delta f$);

wherein the resonator element is further configured so that in response to the force acting in the first direction the resonator element undergoes a transverse expansion that changes the resonance frequency of the resonator element as a function of the force acting in the first direction;

wherein the first piezoelectric transducer element is configured to measure the dynamic component of the force directly in the load path while the resonator element is configured to measure the transverse expansion caused by the static component of the force in an oscillation region that lies outside the load path;

wherein the transverse expansion proceeds in a transverse direction that forms a non-zero angle relative to the first direction; and wherein the transverse expansion has a magnitude that is proportional to the magnitude of the force acting in the first direction.

17. A measurement transducer for measuring a force that can include a dynamic component and a static component that that acts in a first direction along a load path, the measurement transducer comprising:
- a first piezoelectric transducer element defining element surfaces that are configured to generate electrical polarization charges proportional to a magnitude of the force acting in the first direction;
- a resonator element configured to be excited to at least one resonance frequency;
- an oscillator circuit electrically connected to the resonator element and configured to apply an alternating electrical field to the piezoelectric material of the resonator element; and
- an evaluation unit electrically connected to the resonator element and configured to detect a temperature-dependent frequency change ($\Delta f_T$) of a resonance frequency of the resonator element and determine the temperature from the detected temperature-dependent frequency change ($\Delta f_T$);
- wherein the resonator element is further configured so that in response to the force acting in the first direction the resonator element undergoes a transverse expansion that changes the resonance frequency of the resonator element as a function of the force acting in the first direction;
- wherein the first piezoelectric transducer element is configured to measure the dynamic component of the force directly in the load path while the resonator element is configured to measure the transverse expansion caused by the static component of the force in an oscillation region that lies outside the load path;
- wherein the transverse expansion proceeds in a transverse direction that forms a non-zero angle relative to the first direction; and
- wherein the transverse expansion has a magnitude that is proportional to the magnitude of the force acting in the first direction.

* * * * *